(12) United States Patent
Hsiang et al.

(10) Patent No.: US 12,334,148 B2
(45) Date of Patent: Jun. 17, 2025

(54) METHOD OF OPERATING MEMORY CELL

(71) Applicants: TAIWAN SEMICONDUCTOR MANUFACTURING COMPANY, LTD., Hsinchu (TW); NATIONAL TAIWAN UNIVERSITY, Taipei (TW); National Taiwan Normal University, Taipei (TW)

(72) Inventors: Kuo-Yu Hsiang, Kaohsiung (TW); Min-Hung Lee, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 157 days.

(21) Appl. No.: 18/191,668

(22) Filed: Mar. 28, 2023

(65) Prior Publication Data
US 2024/0170059 A1 May 23, 2024

Related U.S. Application Data

(60) Provisional application No. 63/426,079, filed on Nov. 17, 2022.

(51) Int. Cl.
G11C 13/00 (2006.01)

(52) U.S. Cl.
CPC ...... G11C 13/0038 (2013.01); G11C 13/0035 (2013.01); *G11C 2213/31* (2013.01)

(58) Field of Classification Search
CPC ..... G11C 8/08; G11C 11/419; G11C 13/0069; G11C 8/12; G11C 8/14; G11C 13/0038; G11C 17/18; G11C 7/12; G11C 8/10; G11C 11/565; G11C 13/0007; G11C 17/16; G11C 13/0023; G11C 13/0028; G11C 17/165; G11C 2013/0073; G11C 2213/31; G11C 2213/32; G11C 2213/71; G11C 5/063; G11C 7/10; G11C 7/1048; G11C 7/18;
(Continued)

(56) References Cited

U.S. PATENT DOCUMENTS

| 7,495,947 B2 * | 2/2009 | Scheuerlein | ........... G11C 17/16 365/158 |
|---|---|---|---|
| 2018/0374929 A1 | 12/2018 | Yoo | |
| 2020/0105770 A1 | 4/2020 | Yoo | |

OTHER PUBLICATIONS

Chang et al., "The Field-dependence Endurance Model and Its Mutual Effect in Hf-based Ferroelectrics", 2022 IEEE International Reliability Physics Symposium (IRPS), 2022, pp. 3A.1-1-3A.1-5.
(Continued)

*Primary Examiner* — Thong Q Le
(74) *Attorney, Agent, or Firm* — Birch, Stewart, Kolasch & Birch, LLP

(57) ABSTRACT

A method of operating a memory cell includes the following steps. A first plurality of bias operations is performed to the memory cell using a first voltage, wherein the memory cell comprises a variable resistance pattern, and the first voltage of each cycle of the first plurality of bias operations has a same first polarity. The memory cell is determined whether reaches a fatigue threshold. After the determination determines that the memory cell reaches the fatigue threshold, a second plurality of bias operations is performed to the memory cell using a second voltage, wherein the second voltage of each cycle of the second plurality of bias operations has a same second polarity, and the second polarity is opposite to the first polarity.

20 Claims, 24 Drawing Sheets

(58) Field of Classification Search
CPC ... G11C 11/15; G11C 11/161; G11C 11/1659; G11C 11/1673; G11C 11/1675; G11C 11/1693; G11C 11/1697; G11C 11/404; G11C 11/56; G11C 11/5607; G11C 13/0004; G11C 13/0014; G11C 13/0016; G11C 14/0018; G11C 16/0416; G11C 16/0433; G11C 16/06; G11C 16/10; G11C 16/26; G11C 2013/0078; G11C 2211/4016; G11C 2213/72; G11C 5/02; G11C 11/00; G11C 11/405; G11C 11/4074; G11C 11/409; G11C 11/4091; G11C 11/4096; G11C 11/4097; G11C 11/5642; G11C 13/0026; G11C 13/003
USPC .................................................. 365/148, 158
See application file for complete search history.

(56) References Cited

OTHER PUBLICATIONS

Liao et al., "Characterization of Fatigue and Its Recovery Behavior in Ferroelectric HfZrO" 2021 Symposium on VLSI Technology Digest of Technical Papers, 2021, pp. 1-2.
Müller et al., "Ferroelectricity in Simple Binary $ZrO_2$ and $HfO_2$" Nano Lett., Jul. 19, 2012, vol. 12, pp. 4318-4323.
Park et al., "Review and Perspective on Ferroelectric $HfO_2$-Based Thin Films for Memory Applications", MRS Communications, 2018, vol. 8, Issue 3, pp. 795-808.

* cited by examiner

| Memory cell 10 | |
|---|---|
| Variable resist pattern | Antiferroelectric material |
| Thickness (nm) | 8-12 |
| Cycling △V / Frequency (MHz) | 3±1 / 0.25±0.01 |
| Recovery method (△V/frequency (MHz)) | OPCR (3±1 / 0.25±0.01) |
| Cycles per recovery (#) | 1.5e10 - 2.5e10 |
| Recovery time/Period (%) | 0% |
| Cumulative cycles (#) | 5e11 – 6e11 |

Fig. 8

METHOD OF OPERATING MEMORY CELL

PRIORITY CLAIM AND CROSS-REFERENCE

This application claims priority to U.S. Provisional Patent Application Ser. No. 63/426,079, filed Nov. 17, 2022, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is an exemplary table indicating data of memory cell in FIGS. 3A-3C in accordance with some embodiments.

DETAILED DESCRIPTION

Figure 1:
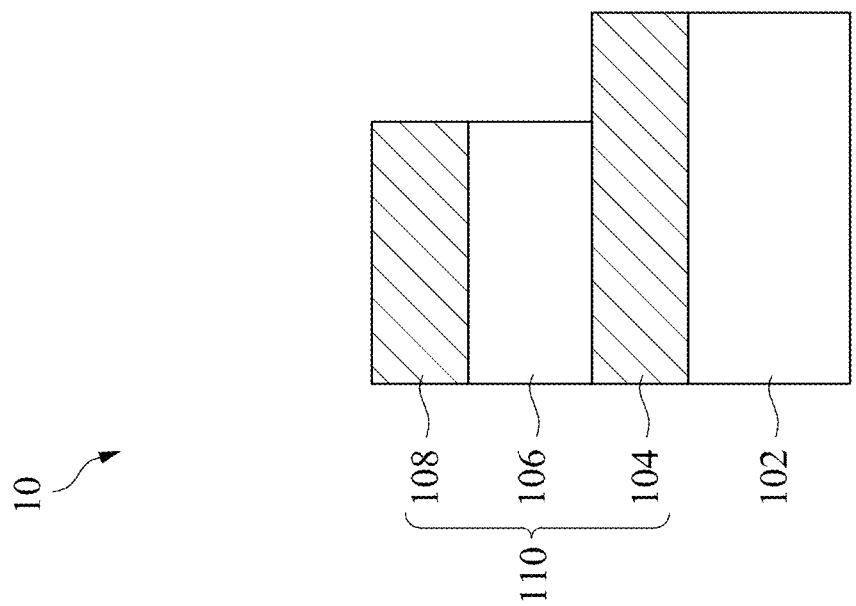
FIG. 1 illustrates a memory cell in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may mean within 20 percent, or within 10 percent, or within 5 percent of a given value or range. Numerical quantities given herein are approximate, meaning that the term "around," "about," "approximately," or "substantially" can be inferred if not expressly stated.

FIG. 1 illustrates a memory cell 10 in accordance with some embodiments. The memory cell 10 may include a substrate 102, a bottom electrode 104, a variable resistance pattern 106 and a top electrode 108, which are sequentially stacked. The bottom electrode 104, the variable resistance pattern 106 and the top electrode 108 constitute a capacitor 110 for storing memory data. The bottom electrode 104 and the top electrode 108 are formed of, for example, a conductive material such as metal, alloy, a compound thereof, or a stack of metal, alloy, the compound thereof. Examples of the bottom electrode 104 and the top electrode 108 include suitable conductive materials, such as TaN, TiN, W, Pt, Mo, Ta, Ti, metal silicide, the like, and/or the combination thereof. The bottom electrode 104 and the top electrode 108 can be a single-layered structure or a multi-layered structure including plural stacked layers of metals and/or metal-containing compounds. In some embodiments, the bottom electrode 104 and the top electrode 108 each have a thickness in a range from about 1 nm to about 1000 nm.

In some embodiment, the variable resistance pattern 106 is an antiferroelectric layer. In some embodiments, the variable resistance pattern may include HfZrO$_2$ (HZO), HAO (Al-Doped HfO$_2$), HSO (Si-Doped HfO$_2$), lead zirconate titanate (PZT), strontium bismuth tantalit (SBT). The variable resistance pattern 106 has the composition of Hf$_{1-x}$Zr$_x$O$_2$ in which x is 0.9, and thus can have an antiferroelectric characteristic demonstrating a double hysteresis loop. In some embodiments, the variable resistance pattern 106 has a thickness in a range from about 0.1 nm to about 50 nm, such as about 10 nm. In use and operation, when the memory cell 10 is selected to be programmed, a programming voltage may be applied to the memory cell 10 to change a polarization state of the variable resistance pattern 106 of the memory cell 10. When the programming voltage is removed, the variable resistance pattern 106 may exhibit a polarization. In a read operation of the memory cell 10, a voltage is used to detect a state of the variable resistance pattern 106.

Figure 2:
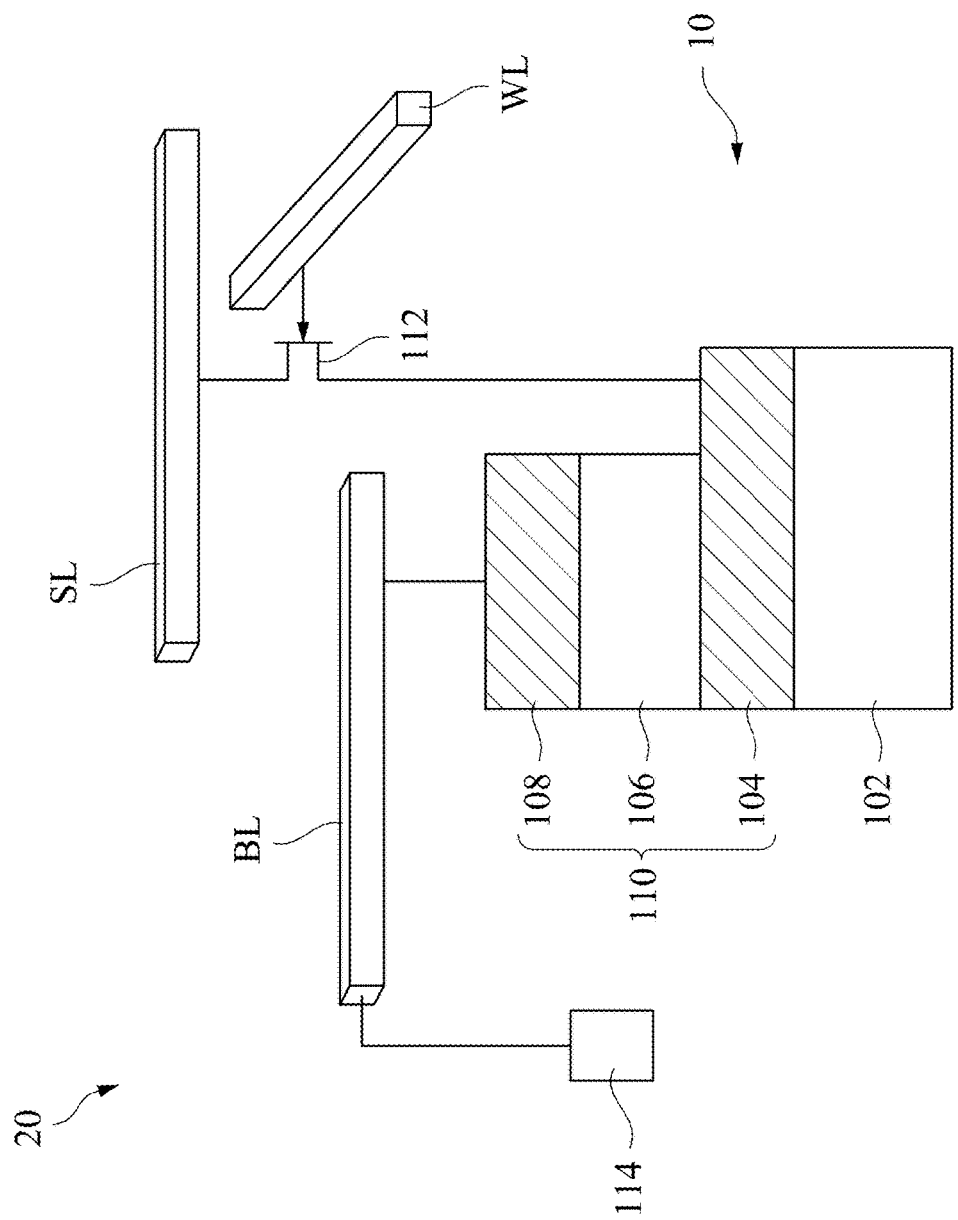
FIG. 2 is a semiconductor device including the memory cell according to some embodiments of the present disclosure.

FIG. 2 is a semiconductor device 20 including the memory cell 10 according to some embodiments of the present disclosure. The semiconductor device 20 includes the memory cell 10 including the capacitor 110, an access transistor 112, a conductive line BL that may function as a data line (e.g., a bit line), a conductive line WL that may function as an access line (e.g., a word line), a conductive line SL that may function as a source line, and a periphery device 114 such as a read/write circuitry. To initiate programming of the memory cell 10, the periphery device 114 may generate a programming voltage to the conductive line BL and the conductive line SL. The polarity of the voltage between the conductive line BL and the conductive line SL may determine the polarization direction of the variable resistance pattern 106 in the capacitor 110. The programmed logic state of the memory cell 10 may be a function of the direction of polarization of the variable resistance pattern 106 of the capacitor 110. To read the memory cell 10, the periphery device 114 may generate a read voltage to the conductive line BL and the conductive line SL through the capacitor 110 and the access transistor 112. The programmed state of the memory cell 10 may be related to a direction of the polarization of the variable resistance pattern 106 in the capacitor 110.

Figure 3A:
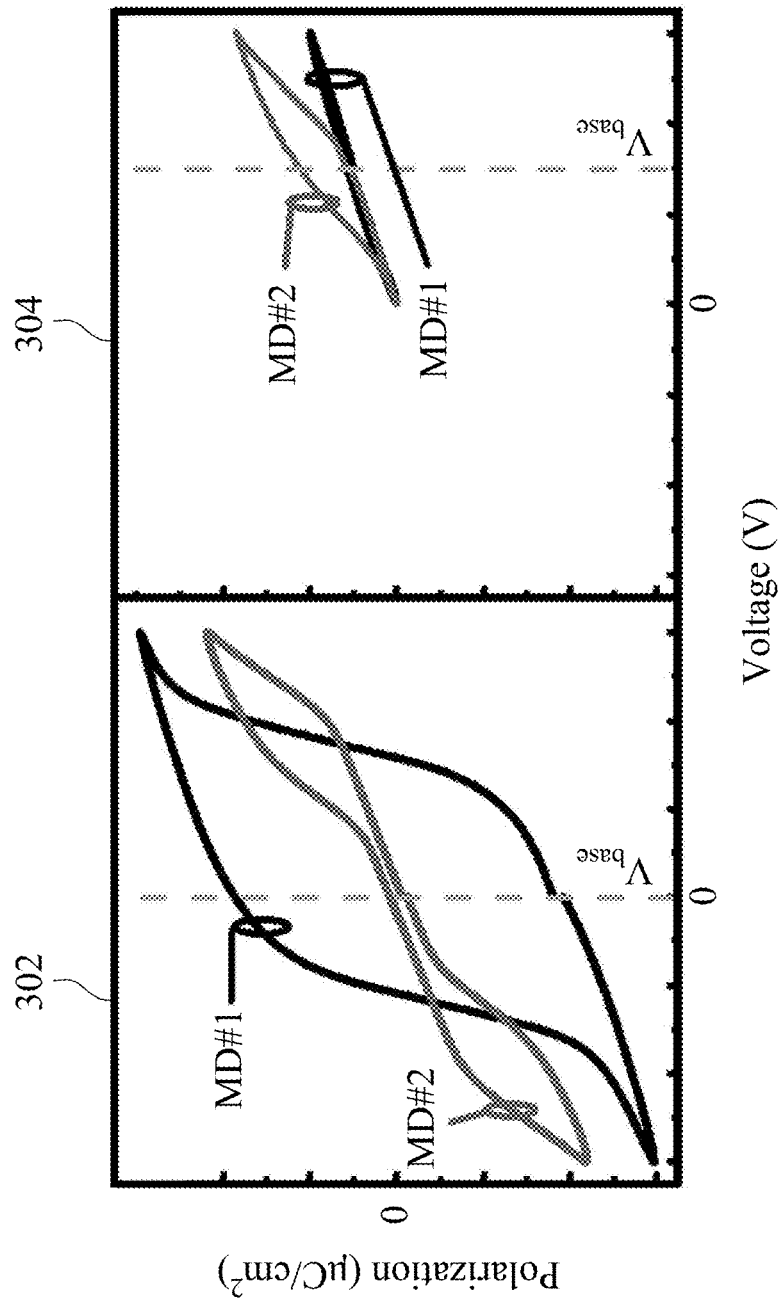
FIG. 3A has a section showing polarization responses of a memory cell and a memory cell under bipolar bias operations in accordance with some embodiments.

FIG. 3A has a section 302 showing polarization responses of a memory cell MD #1 and a memory cell MD #2 under bipolar bias operations in accordance with some embodiments. FIG. 3B has a section 304 showing polarization responses of the memory cell MD #1 and the memory cell MD #2 under unipolar bias operations in accordance with some embodiments. The memory cell MD #1 and the memory cell MD #2 may each have a structure similar to the memory cell 10 in FIG. 1 while in which the variable resistance patterns therein have different compositions. For example, the memory cell MD #1 includes a variable resistance pattern having a composition of Hf$_{1-x}$Zr$_x$O$_2$ in which x is 0.5. The memory cell MD #2 includes the variable resistance pattern having a composition of Hf$_{1-x}$Zr$_x$O$_2$ in which x is 0.9.

Reference is made to the section 302 in FIG. 3A. Under the bipolar bias operation, the memory cell MD #1 with the variable resistance pattern having the composition of Hf$_{1-x}$Zr$_x$O$_2$ in which x is 0.5 can have a ferroelectric characteristic demonstrating a spontaneous non-zero polarization even when the applied electric field is zero. As such, the spontaneous polarization can be reversed by an applied electric field in the opposite direction. This results in a single hysteresis loop because the polarization of the ferroelectric material is dependent not only on the present electric field but also on its history. By contrast, the memory cell MD #2 with the variable resistance pattern having the composition of Hf$_{1-x}$Zr$_x$O$_2$ in which x is 0.9 can have an antiferroelectric characteristic demonstrating a double hysteresis loop. In the section 302, a base voltage (V$_{base}$) is about zero.

Reference is made to the section 304 in FIG. 3A. Under the unipolar bias operation, the memory cell MD #1 with the variable resistance pattern having the composition of Hf$_{1-x}$Zr$_x$O$_2$ in which x is 0.5 can have a paraelectric characteristic demonstrating paraelectric or linear polarization properties. By contrast, the memory cell MD #2 with the variable resistance pattern having the composition of Hf$_{1-x}$Zr$_x$O$_2$ in which x is 0.9 demonstrates a single hysteresis loop. In the unipolar bias operation, a constant base voltage (V$_{base}$) is provided to retain the information of the memory cell MD #1 and the memory cell MD #2, and the write voltage is applied to switch the polarization to the low resistance state (LRS) by applying a programming voltage (V$_p$) greater than the constant base voltage (V$_{base}$) or to the high resistance state (HRS) by applying a programming voltage (V$_p$) equal to zero. In some embodiments, the base voltage (V$_{base}$) is in a range from 1 V to 2 V, such about 1.5 V, and the programming voltage (V$_p$) to switch the polarization to the LRS is about 2.5 V to 3.5 V, such as about 3V.

FIG. 3B is a diagram illustrating normalized switching polarizations (2P$_r$) versus programming pulse width (t$_p$) with regard to the memory cell MD #1 and the memory cell MD #2 under unipolar bias operations in accordance with some embodiments. The result of FIG. 3B is related to a response speed with respect to the memory cell MD #1 and the memory cell MD #2. In FIG. 3B, the memory cell MD #2 shows an available ratio of switching polarization higher than that of the memory cell MD #1 with a programming pulse width (t$_p$) less than 1 μs.

Figure 3C:
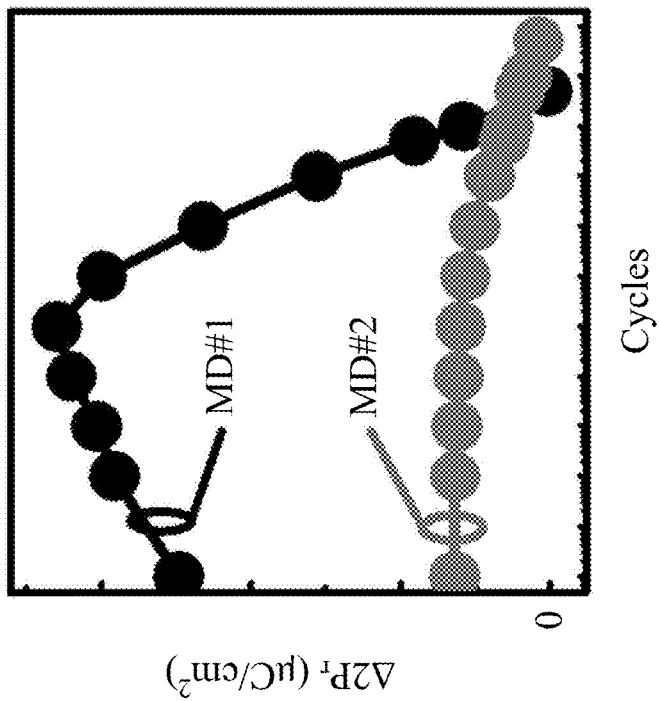
FIG. 3C is a diagram illustrating switching polarizations ($2P_r$) versus switching cycles with regard to the memory cell and the memory cell under unipolar bias operations in accordance with some embodiments.
Figure 3B:
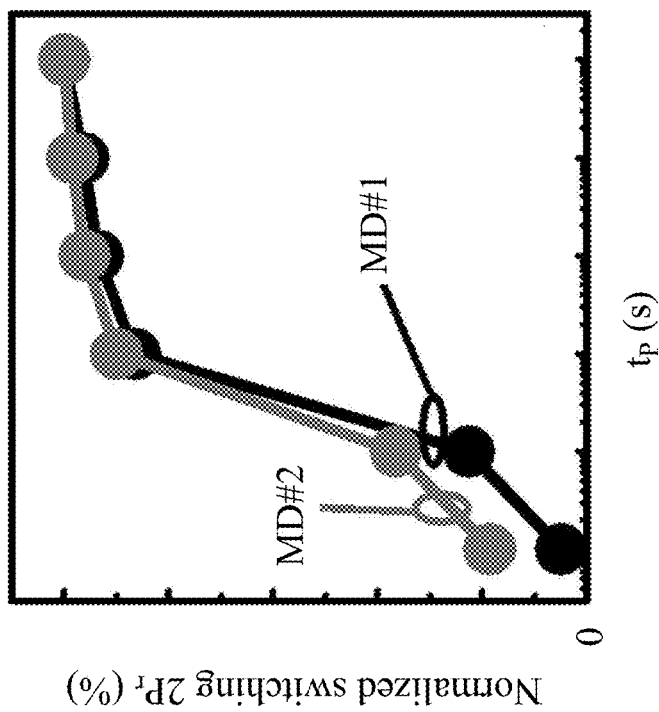
FIG. 3B has a section showing polarization responses of the memory cell and the memory cell under unipolar bias operations in accordance with some embodiments.

FIG. 3C is a diagram illustrating switching polarizations (2P$_r$) versus switching cycles with regard to the memory cell MD #1 and the memory cell MD #2 under unipolar bias operations in accordance with some embodiments. The result of FIG. 3C is related to endurance with respect to the memory cell MD #1 and the memory cell MD #2. In FIG. 3C, the switching polarizations (2P$_r$) are measured at about 0.25±0.01 MHz with programming pulse width (t$_p$) of about 0.5ρs to 1.5 ρs, such as about 1 ρs. The memory cell MD #1 exhibits a ferroelectric wakeup and an electrical fatigue effect with field cycling. By contrast, the memory cell MD

2 exhibits robust endurance. In other words, the memory cell MD #2 has an endurance being more robust than an endurance of the memory cell MD #1.

Figure 4B:
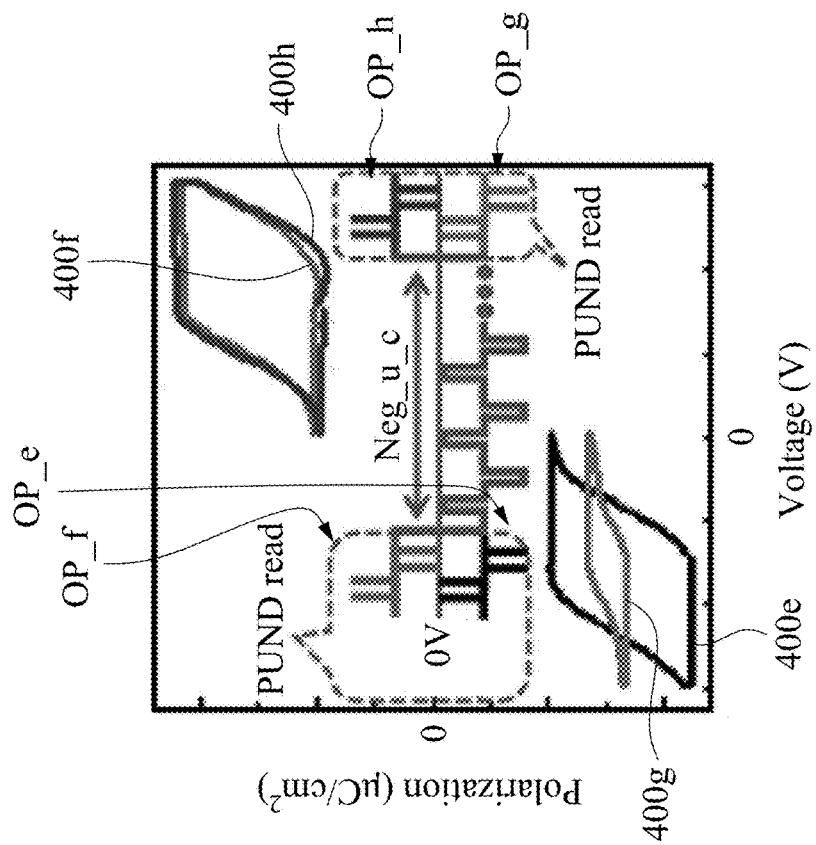
FIG. 4B shows a polarization-voltage (P-V) characteristic with regard to the memory cell in FIGS. 3A-3C in accordance with some embodiments.
Figure 4A:
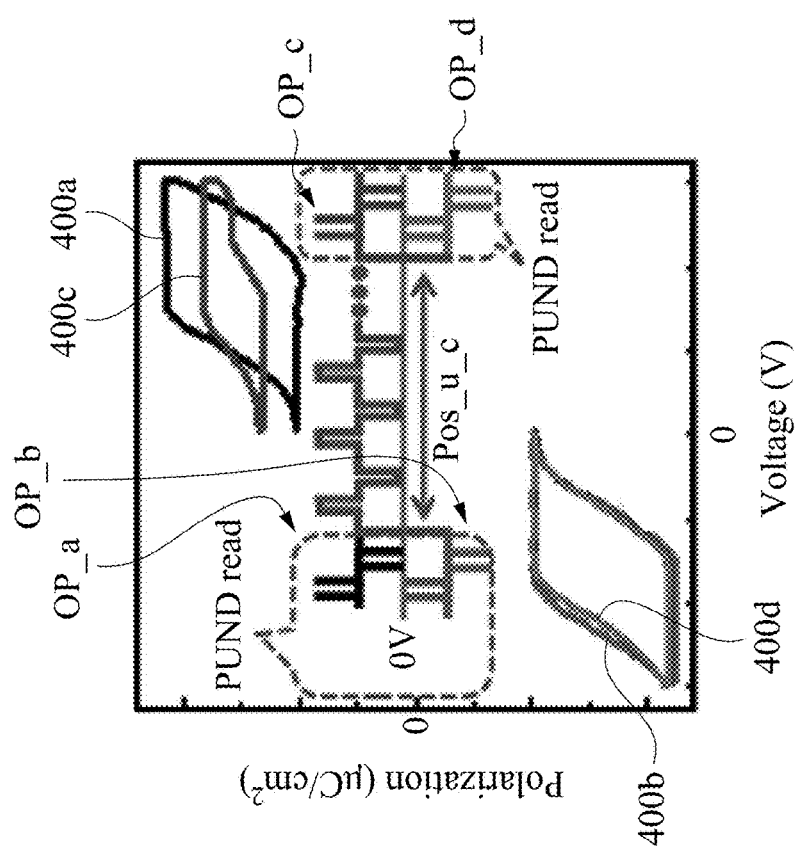
FIG. 4A shows polarization-voltage (P-V) characteristic with regard to the memory cell in FIGS. 3A-3C in accordance with some embodiments.

FIG. 4A shows polarization-voltage (P-V) characteristic with regard to the memory cell 10 in FIG. 1 in accordance with some embodiments. Reference is made to FIGS. 1 and 4A. A read operation is performed using positive-up-negative down (PUND) pulse sequence under positive unipolar switching cycling Pos_u_c. A constant base voltage ($V_{base}$) is provided to retain the information of the memory cell 10, and the write voltage is applied to switch the polarization to the low resistance state (LRS) by applying a programming voltage ($V_p$) greater than the constant base voltage ($V_{base}$) or to the high resistance state (HRS) by applying a programming voltage ($V_p$) equal to zero. In some embodiments, the base voltage ($V_{base}$) is in a range from 1 V to 2 V, such as about 1.5 V. In the positive unipolar switching cycling, a first cycle OP_a exhibits a hysteresis loop 400a, and an nth cycle OP_c exhibits a hysteresis loop 400c which shows a polarization behavior weaker than a polarization behavior of the hysteresis loop 400a. That is, after a sufficient amount of positive unipolar switching cycling, a significant degradation or fatigue of the P-V characteristic happens in the positive polarity.

In an opposite polarity (i.e., negative polarity) of the positive unipolar switching cycling, a first cycle OP_b exhibits a hysteresis loop 400b, and the nth cycle OP_d exhibits a hysteresis loop 400d which shows substantially the same as the hysteresis loop 400b. In other words, the hysteresis loop 400b overlaps the hysteresis loop 400d. That is, no degradation or fatigue of the P-V characteristic happens in the negative polarity. In other words, after a large amount of positive unipolar switching cycling, the P-V characteristic can maintain an initial state in the opposite polarity of the positive unipolar switching cycling.

FIG. 4B shows a polarization-voltage (P-V) characteristic with regard to the memory cell 10 in FIG. 1 in accordance with some embodiments. Reference is made to FIGS. 1, 4A and 4B. The difference between FIG. 4B and FIG. 4A is that in FIG. 4B, a read operation is performed under negative unipolar switching cycling Neg_u_c. A constant base voltage ($V_{base}$) is provided to retain the information of the second memory cell, and the write voltage is applied to switch the polarization to the low resistance state (LRS) by applying a programming voltage ($V_p$) less than the constant base voltage ($V_{base}$) or to the high resistance state (HRS) by applying a programming voltage ($V_p$) equal to zero. In some embodiments, the base voltage ($V_{base}$) is about −2V to −1V, such as about −1.5 V. In the negative unipolar switching cycling, a first cycle OP_e exhibits a hysteresis loop 400e, and an nth cycle OP_g exhibits a hysteresis loop 400g which shows a polarization behavior weaker than a polarization behavior of the hysteresis loop 400e. That is, after a sufficient amount of negative unipolar switching cycling, a significant degradation or fatigue of the P-V characteristic happens in the negative polarity.

In an opposite polarity (i.e., positive polarity) of the negative unipolar switching cycling, a first cycle OP_f exhibits a hysteresis loop 400f, and an nth cycle OP_h exhibits a hysteresis loop 400h which shows substantially the same as the hysteresis loop 400f. In other words, the hysteresis loop 400f overlaps the hysteresis loop 400h. That is, no degradation or fatigue of the P-V characteristic happens in the positive polarity. In other words, after a large amount of negative unipolar switching cycling, the P-V characteristic can maintain an initial state in the opposite polarity of the negative unipolar switching cycling. According to the results of FIGS. 4A and 4B, the memory cell 10 can have sufficient memory states, such as four memory states, including the low resistance state (LRS) and high resistance state (HRS) in the positive polarity and the low resistance state (LRS) and high resistance state (HRS) in the negative polarity, for the unipolar switching cycling.

Figure 4D:
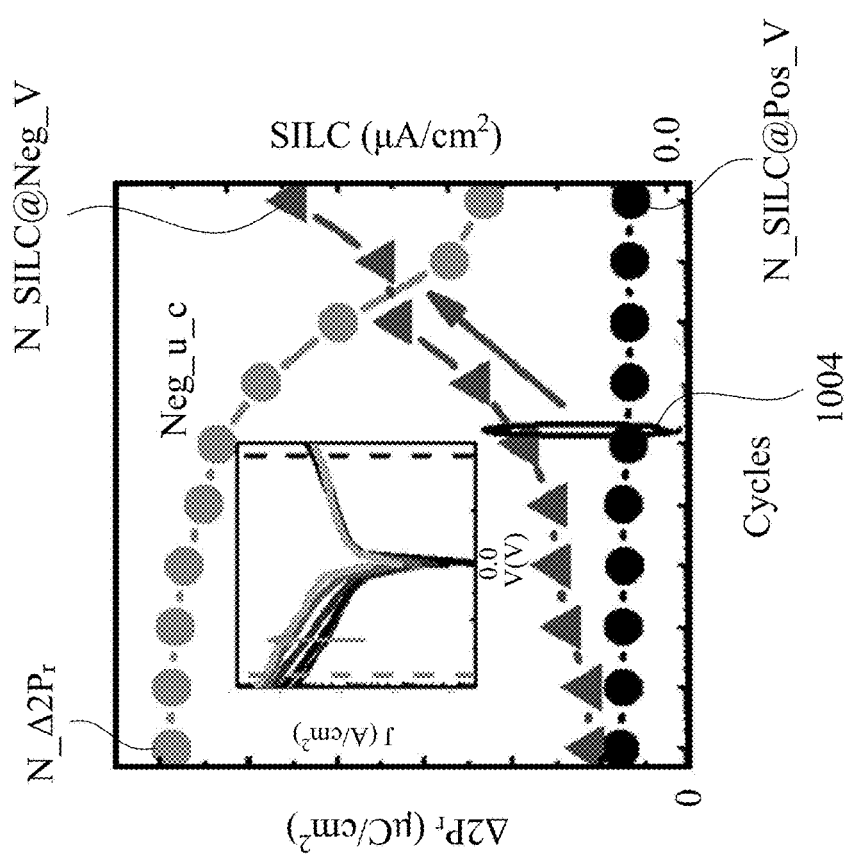
FIG. 4D is a chart of normalized polarization ($\Delta 2P_r$) overlying stress-induced leakage current (SILC) using the negative unipolar switching cycling in FIG. 4B with respect to the memory cell in accordance with some embodiments.
Figure 4C:
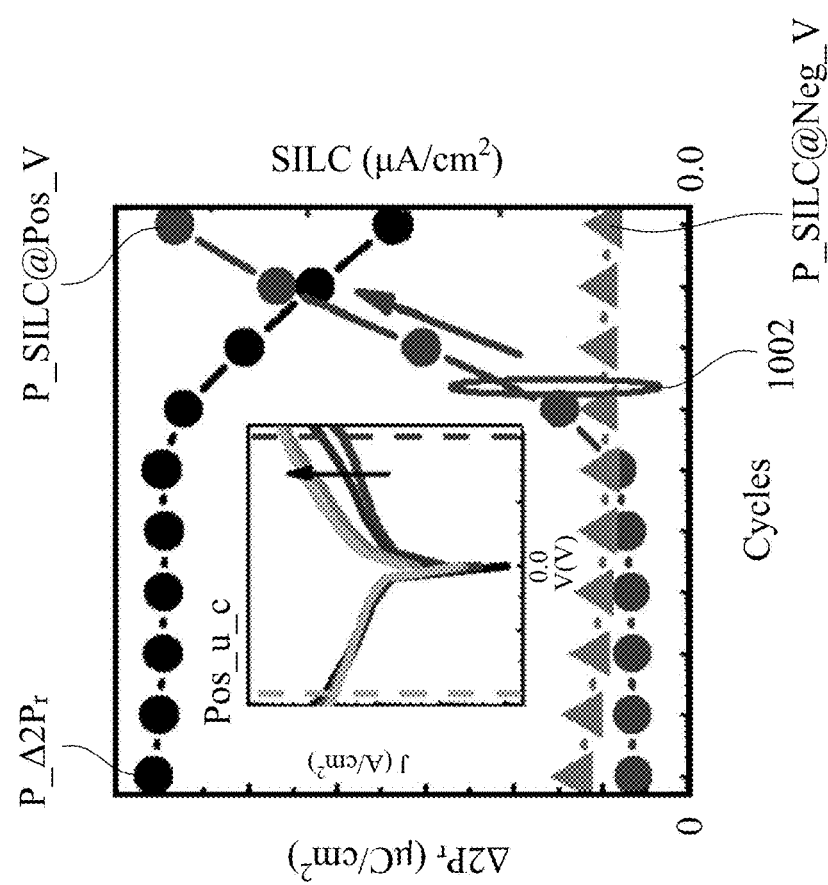
FIG. 4C is a chart of normalized polarization ($\Delta 2P_r$) overlying stress-induced leakage current (SILC) using the positive unipolar switching cycling in FIG. 4A with respect to the memory cell in accordance with some embodiments.

FIG. 4C is a chart of normalized polarization ($\Delta 2P_r$) overlying stress-induced leakage current (SILC) using the positive unipolar switching cycling Pos_u_c in FIG. 4A with respect to the memory cell 10 in FIG. 1 in accordance with some embodiments. Reference is made to FIG. 1 and FIG. 4C. With regard to the result of the normalized polarization ($\Delta 2P_r$), the normalized polarization P_$\Delta 2Pr$ decreases after a sufficient amount of switching cycles. Also, a curve P_SILC@Pos_V shows a cycling of the same polarity resulting in a rise 1002 of SILC (which is also indicated by an arrow), but a curve P_SILC@Neg_V shows the SILC with opposite polarity remaining almost unchanged. In some embodiments, in the curve P_SILC@Pos_V, the SILC is measured at about 1±0.5V, and in the curve P_SILC@Neg_V, the SILC is measured at about −1.5V to −0.5V, such as about −1V. An inset figure in FIG. 4C depicts I-V characteristic of the memory cell 10 at different stages of the positive unipolar switching cycling. Under a positive voltage, a current density shift toward a high value due to the stress-induced leakage current (SILC) is shown, while under a negative voltage, no current density shift is shown.

FIG. 4D is a chart of normalized polarization ($\Delta 2P_r$) overlying stress-induced leakage current (SILC) using the negative unipolar switching cycling Neg_u_c in FIG. 4B with respect to the memory cell 10 in FIG. 1 in accordance with some embodiments. Reference is made to FIG. 1 and FIG. 4D. With regard to the result of the normalized polarization ($\Delta 2P_r$), the normalized polarization N_$\Delta 2Pr$ decreases after a sufficient amount of switching cycles. Also, a curve N_SILC@Neg_V shows a cycling of the same polarity resulting in a rise 1004 of SILC (which is also indicated by an arrow), but a curve N_SILC@Pos_V shows the SILC with opposite polarity remaining almost unchanged. In some embodiments, in the curve N_SILC@Neg_V, the SILC is measured at about −1V, and in the curve N_SILC@Pos_V, the SILC is measured at about 1V. An inset figure in FIG. 4D depicts I-V characteristic of the memory cell MD #2 at different stages of the negative unipolar switching cycling. Under a negative voltage, a current density shift toward a high value due to the stress-induced leakage current (SILC) is shown, while under positive voltage, no current density shift is shown. The results of the normalized polarization ($\Delta 2P_r$), SILC and IV characteristic indicate that by using the unipolar bias operations, the positive AFE loop and the negative AFE loop can exhibit independent polarities on fatigue and SILC.

Figure 5A:
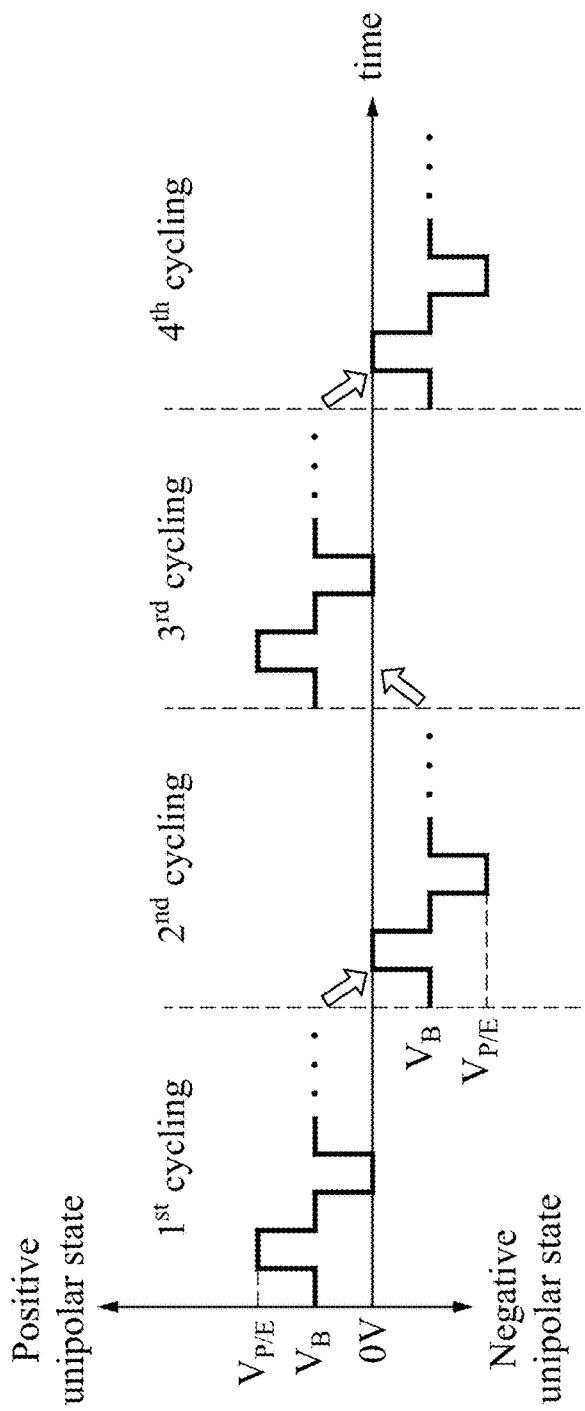
FIG. 5A is a chart illustrating opposite polarity cycling recovery (OPCR) operation with regard to the memory cell in accordance with some embodiments.
Figure 5B:
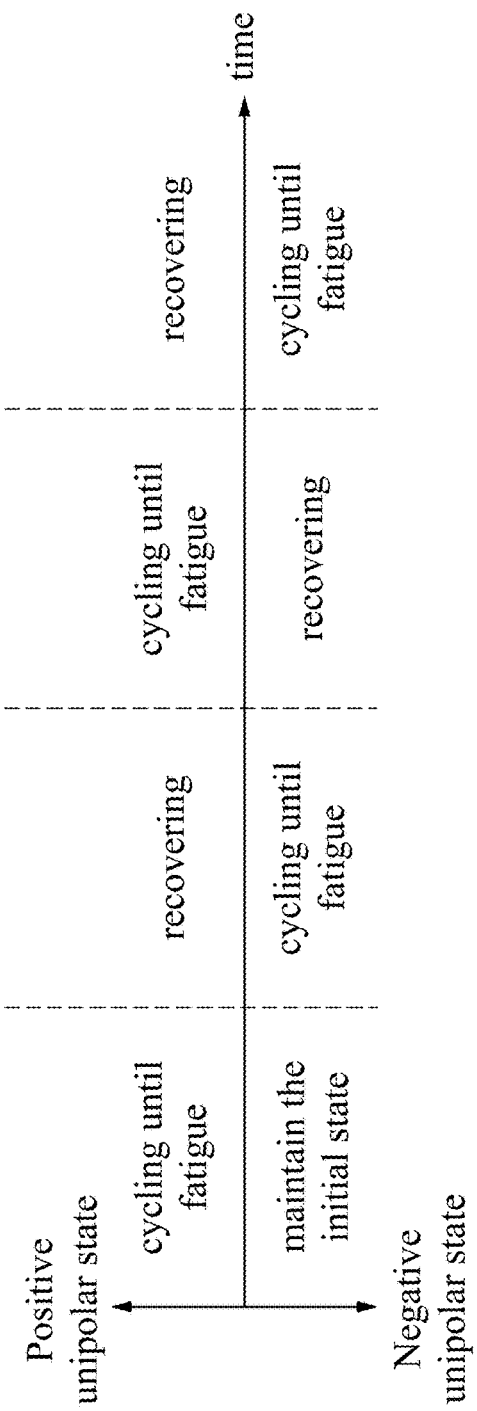
FIG. 5B is a chart illustrating operation description of FIG. 5A.

FIG. 5A is a chart illustrating opposite polarity cycling recovery (OPCR) operation with regard to the memory cell 10 in FIG. 1 in accordance with some embodiments. FIG. 5B is a chart illustrating operation description of FIG. 5A. Reference is made to FIGS. 1, 5A and 5B. A first plurality of bias operations is performed to the memory cell 10 using a first voltage, and the first voltage of each cycle of the first plurality of bias operations has a same first polarity. For example, a $1^{st}$ cycling illustrates example positive voltage cycling of the memory cell 10 with time. A $2^{nd}$ cycling illustrates negative voltage cycling of the memory cell 10 with time. In some embodiments, in the $1^{st}$ cycling, the memory cell 10 is cycled until its polarization decreases due to fatigue. That is, the memory cell 10 is determined whether reaching a fatigue threshold. In other words, during the first plurality of bias operations, the memory cell 10 is cycled until its polarization decreases due to fatigue, which is characterized by a reduction in the remnant polarization after successive cycles. The fatigue threshold is determined by monitoring the remnant polarization, and a specific reduction percentage, such as 10% or 20%, could be used as the threshold to indicate fatigue. In particular, when the memory cell 10 reaches the fatigue threshold or enters a fatigue state, its remnant polarization is reduced compared to previous bias operations. For example, the memory cell 10 retains a first remnant polarization in response to an initial operation in the first plurality of bias operations. A final operation in the first plurality of bias operations is defined by the memory cell 10 storing a second remnant polarization in response to this final operation, with the second remnant polarization being lower than the first remnant polarization.

Reference is made to FIGS. 1, 5A, 5B and 4A. When the memory cell 10 is determined having reached a fatigue threshold, the memory cell 10 has a fatigue hysteresis loop. The fatigue hysteresis loop means less charge may be stored in the memory cell 10. The fatigued memory cell 10 may have a reduced remnant polarization compared to the remnant polarization of a pristine memory cell 10. In some embodiments, under the positive voltage cycling of the memory cell 10 with time, the fatigue threshold is defined as when a read or write voltage $V_{P/E}$ such as about 3±1V is used and a base voltage $V_B$ such as about 1.5±1V is used, a remnant polarization of the memory cell 10 has an absolute value lower than about 5 µC/cm². The memory cell 10 is cycled until the memory cell 10 is fatigued using the positive bias operation. For example, a read or write voltage $V_{P/E}$ such as about 3±1V is used, and a base voltage $V_B$ such as about 1.5±1V is used.

After the determination determines that the memory cell 10 reaches the fatigue threshold, a second plurality of bias operations is performed to the memory cell 10 using a same second voltage. The second voltage of each cycle of the second plurality of bias operations has a second polarity opposite to the first polarity. For example, in the $2^{nd}$ cycling, due to the P-V characteristic of the memory cell 10 under opposite polarity maintain the initial state, the memory cell 10 can be cycled (e.g., cycled through read or write operations) under the negative voltage, and thus can be referred to as a recovery or an opposite polarity cycling recovery (OPCR). That is, the memory cell 10 is recovered using a negative bias operation. This OPCR helps in the recovery of the remnant polarization by mitigating the fatigue effects experienced during the first plurality of bias operations. The read or write voltage $V_{P/E}$ of the $2^{nd}$ cycling has an amplitude not greater than an amplitude of the read or write voltage $V_{P/E}$ of the $1^{st}$ cycling. In some embodiments, the read or write voltage $V_{P/E}$ of the $2^{nd}$ cycling has the amplitude substantially the same as the amplitude of the read or write voltage $V_{P/E}$ of the $1^{st}$ cycling. In some embodiments, an absolute value of the read or write voltage $V_{P/E}$ of the $2^{nd}$ cycling is less than about 8 volts. In some embodiments, the read or write voltage $V_{P/E}$ of the $1^{st}$ cycling is less than about 8 volts. In some embodiments, a read or write voltage $V_{P/E}$ in a range from −4 to −2 V, such as about −3V is used, and a base voltage $V_B$ in a range from −2V to −1V, such as about −1.5V is used. The memory cell 10 is recovered using the negative bias operation (i.e., the $2^{nd}$ cycling) until the memory cell 10 is fatigued again.

Reference is made to FIGS. 1, 5A, 5B and 4B. When the memory cell 10 is determined as being fatigued, the memory cell 10 has a fatigue hysteresis loop. The fatigue hysteresis loop means less charge may be stored in the memory cell 10. The fatigued memory cell 10 may have a reduced remnant polarization compared to the remnant polarization of a pristine memory cell 10. In some embodiments, under the negative voltage cycling of the memory cell 10 with time, the fatigue threshold is defined as when a read or write voltage $V_{P/E}$ in a range from −4V to −2V is used and a base voltage $V_B$ in a range from −1.5±1V is used, a remnant polarization of the memory cell 10 has an absolute value lower than about 5 µC/cm².

Then, a $3^{rd}$ cycling is operated to the memory cell 10 to cycle the memory cell 10 until the memory cell 10 is fatigued using a positive bias operation. The $3^{rd}$ cycling illustrates example positive voltage cycling of the memory cell 10 with time, which is similar to the $1^{st}$ cycling. The memory cell 10 is recovered using the positive bias operation (i.e., the $3^{rd}$ cycling) until the memory cell is fatigued. Then, a $4^{th}$ cycling is operated to the memory cell 10 to cycle the memory cell 10 until the memory cell 10 is fatigued using a negative bias operation. The $4^{th}$ cycling illustrates negative voltage cycling of the memory cell 10 with time, which is similar to the $2^{nd}$ cycling. In FIG. 5A, the unipolar bias operation starts at the positive unipolar state.

Figure 5C:
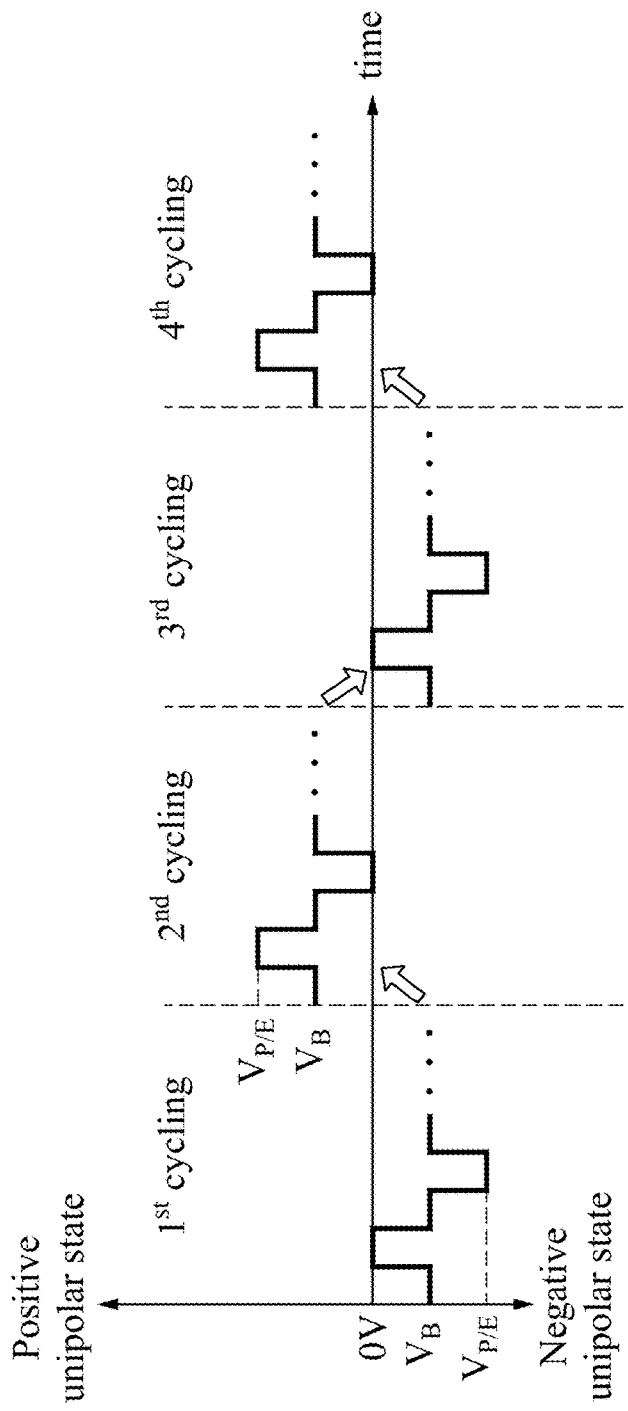
FIG. 5C is a chart illustrating opposite polarity cycling recovery (OPCR) operation with regard to the memory cell in accordance with some embodiments.
Figure 5D:
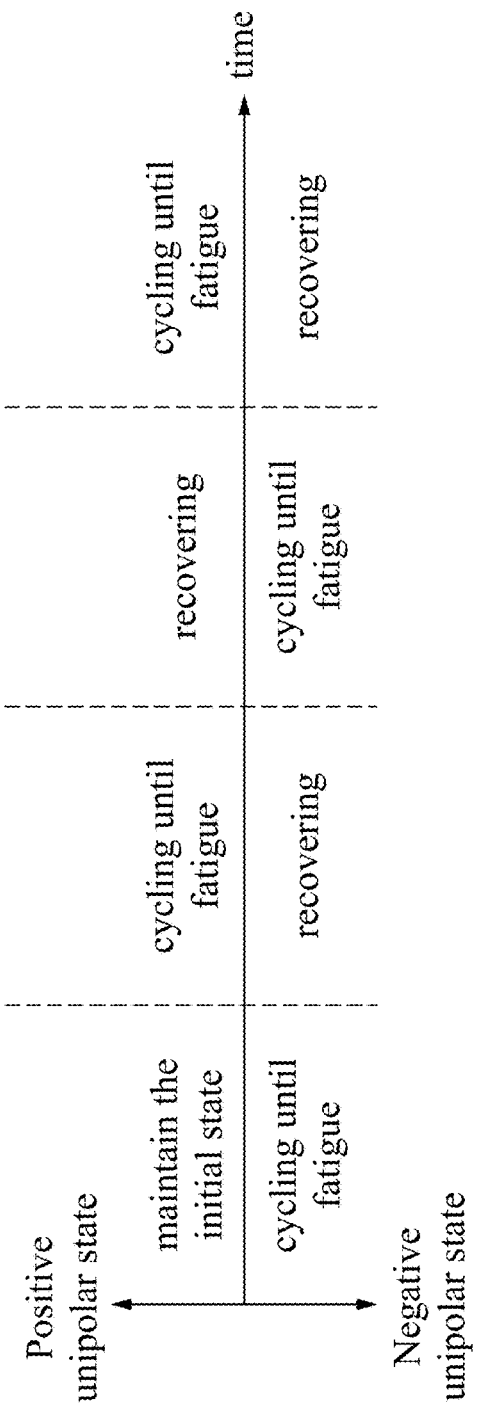
FIG. 5D is a chart illustrating operation description of FIG. 5C.

FIG. 5C is a chart illustrating opposite polarity cycling recovery (OPCR) operation with regard to the memory cell 10 in accordance with some embodiments. FIG. 5D is a chart illustrating operation description of FIG. 5C. The difference between the charts in FIGS. 5A-5B and FIGS. 5C-5D is that the unipolar bias operation starts at the negative unipolar state. Reference is made to FIGS. 1, 5C and 5D. A $1^{st}$ cycling illustrates example negative cycling of the memory cell 10 with time. A $2^{nd}$ cycling illustrates positive voltage cycling of the memory cell 10 with time. In some embodiments, in the $1^{st}$ cycling, the memory cell 10 is cycled until its polarization decreases due to fatigue. For example, a read or write voltage $V_{P/E}$ in a range from −4V to −2V, such as about −3V is used, and a base voltage $V_B$ in a range from −2V to −1V, such as about −1.5V is used. In the $2^{nd}$ cycling, due to the P-V characteristic of the memory cell 10 under opposite polarity maintain the initial state, the memory cell 10 can be cycled (e.g., cycled through read or write operations) under the positive voltage, and thus can be referred to as a recovery or an opposite polarity cycling recovery (OPCR). In some embodiments, a read or write voltage $V_{P/E}$ in a range from 2V to 4V, such as about 3V is used, and a base voltage $V_B$ in a range from 1V to 2V, such as about 1.5V is used. A $3^{rd}$ cycling illustrates example negative voltage cycling of the memory cell 10 with time, which is similar to the $1^{st}$ cycling. A $4^{th}$ cycling illustrates positive voltage cycling of the memory cell 10 with time, which is similar to the $2^{nd}$ cycling.

Referring to FIGS. 1, 5A and FIG. 5C, according to further aspects, the recovery of the memory cell 10 may include an electrical signal waveform of a square wave shape. In some other embodiments, the recovery of the memory cell 10 may include an electrical signal waveform of a sine wave shape, a triangular wave shape, or a combination thereof. The electrical signal waveform may be a single waveform or a plurality of waveforms.

Figure 6A:
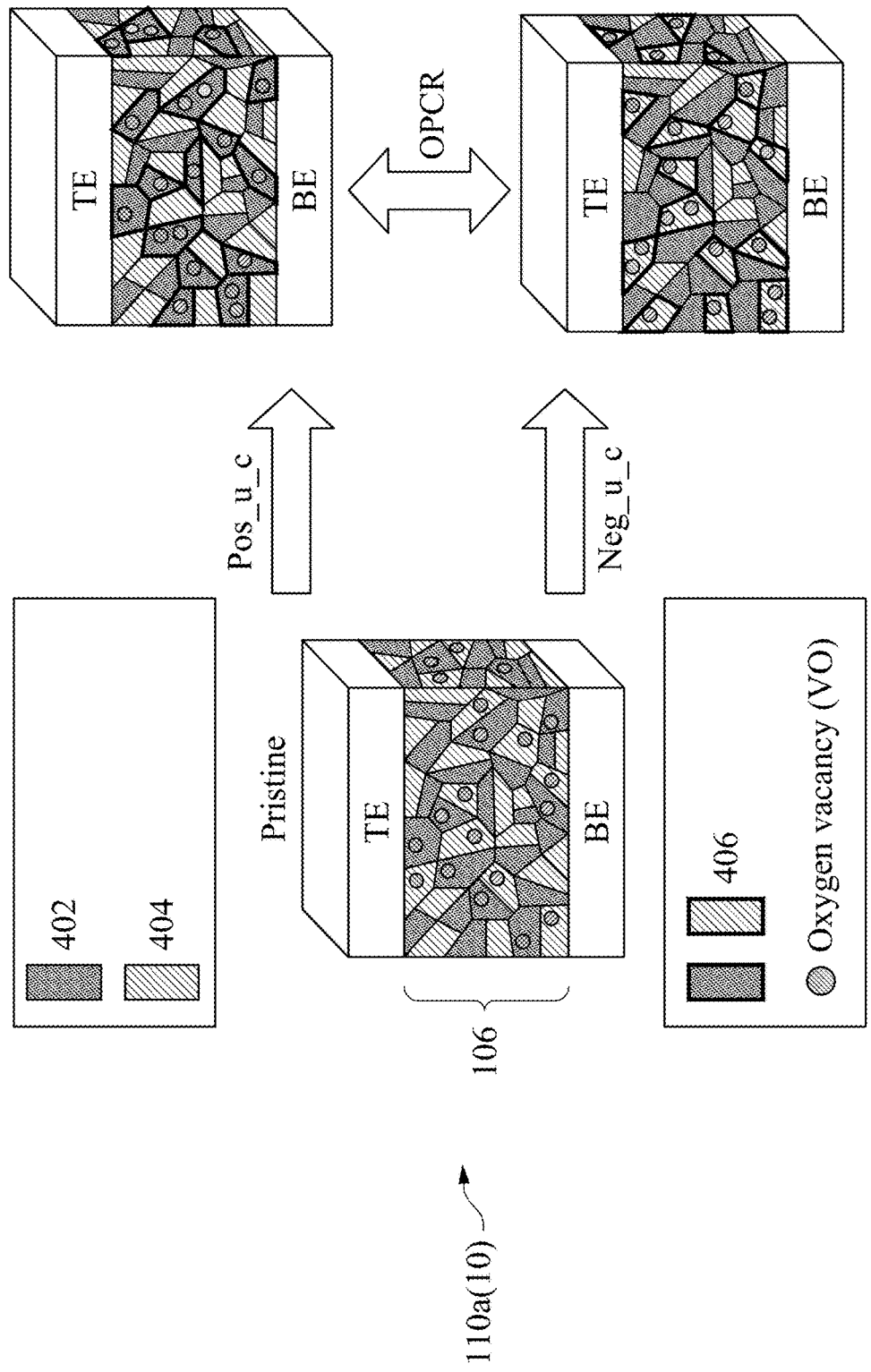
FIG. 6A shows a perspective view of a capacitor of a memory cell in accordance with some embodiments.

FIG. 6A shows a perspective view of a capacitor 110a of the memory cell 10 (see FIG. 1) in accordance with some embodiments. The capacitor 110a is similar to the capacitor 110 in FIG. 1 and includes a bottom electrode BE, a variable resistance pattern 106 and a top electrode TE, which are sequentially stacked. Domains of the variable resistance pattern 106 can be divided into positive and negative polarities independently of with tetragonal phase. For example, the domains are formed by active AFE positive unipolar domains 402 and active AFE negative unipolar domains 404. The capacitor 110a has the variable resistance pattern 106 with a pristine state at first, in which the oxygen vacancies may be in both of the AFE positive unipolar domains 402 and the active AFE negative unipolar domains 404. Using the unipolar cycling operation allows oxygen vacancies (VO) accumulate in corresponding domains, forming pinning AFE domains 406 while non-operated domains of the opposite polarity remain almost unchanged.

For example, by operating the capacitor 110a of the memory cell 10 using the positive unipolar switching cycling Pos_u_c, the oxygen vacancies accumulate in a portion of the AFE positive unipolar domains 402. That is, the capacitor 110a of the memory cell 10 is operated using a positive voltage. The capacitor 110a of the memory cell 10 is performed until the memory cell 10 is fatigued. By performing the opposite polarity cycling operation OPCR, the oxygen vacancies can be redistributed, returning to the initial state (i.e., the pristine state). That is, the oxygen vacancies accumulate in the portion of the AFE positive unipolar domains 402 are redistributed to a portion of the AFE negative unipolar domains 404. The step of redistributing the oxygen vacancies is performed using the unipolar bias operation and is performed until the memory cell 10 is fatigued. The step of operating the memory cell 10 and the step of redistributing the oxygen vacancies are performed using opposite voltages.

Similarly, by operating the capacitor 110a of the memory cell 10 using the negative unipolar switching cycling Neg_u_c, the oxygen vacancies accumulate in a portion of the AFE negative unipolar domains 404. By performing the opposite polarity cycling operation OPCR, the oxygen vacancies can be redistributed, returning to the initial state (i.e., the pristine state). That is, the oxygen vacancies accumulate in the portion of the AFE negative unipolar domains 404 are redistributed to a portion of the AFE positive unipolar domains 402.

Figure 6B:
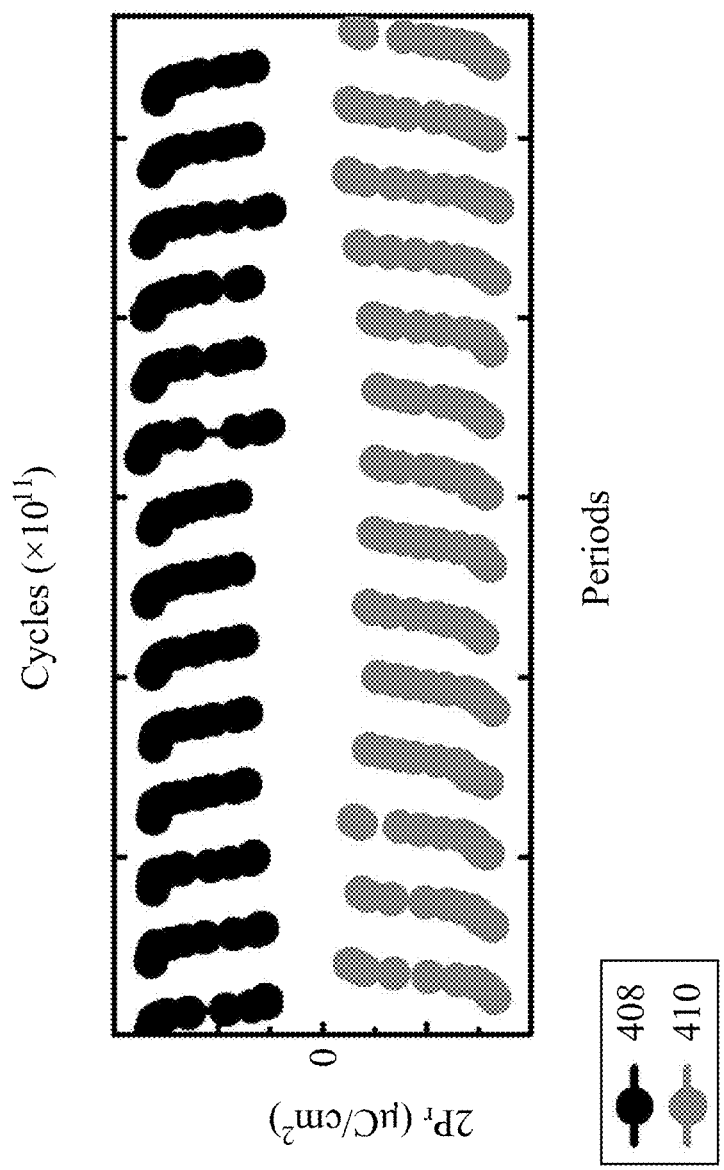
FIG. 6B is a chart of normalized polarization ($\Delta 2Pr$) of switching cycling with respect of the memory cell in FIGS. 3A-3C in accordance with some embodiments.

FIG. 6B is a chart of normalized polarization (Δ2Pr) of switching cycling with respect of the memory cell 10 in FIG. 1 in accordance with some embodiments. Reference is made to FIGS. 1 and 6B. Plots 408 are positive unipolar switching cycling while plots 410 are negative unipolar switching cycling. The memory cell 10 with unipolar switching cycling and OPCR can undergo more than about 28±1 periods in which a period is in a range from $1.5 \times 10^{10}$ to $2.5 \times 10^{10}$, such as about $2 \times 10^{10}$ cycles with alternate polarity and accumulation in a range from $5 \times 10^{11}$ to $6 \times 10^{11}$, such as about $5.6 \times 10^{11}$ switching cycles, indicating that the OPCR can provide non-degradation and complete restoration of polarization (Pr).

Figure 7A:
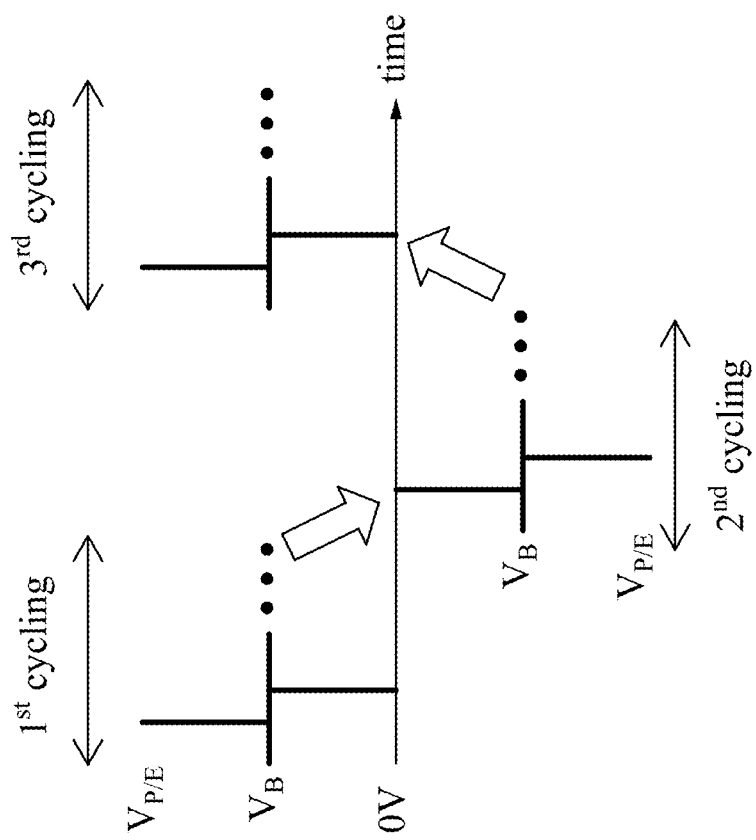
FIG. 7A is a chart illustrating opposite polarity cycling recovery (OPCR) operation with time with regard to the memory cell in FIGS. 3A-3C in accordance with some embodiments.

FIG. 7A is a chart illustrating opposite polarity cycling recovery (OPCR) operation with time with regard to the memory cell 10 in FIG. 1 in accordance with some embodiments. Reference is made to FIGS. 1 and 7A. In FIG. 7A, a first plurality of switching cycles is labeled as $1^{st}$ cycling, a second plurality of switching cycles is labeled as $2^{nd}$ cycling, and a third plurality of switching cycles is labeled as $3^{rd}$ cycling. In the $1^{st}$ cycling and the $3^{rd}$ cycling, a positive bias operation is operated, for example, a read or write voltage $V_{P/E}$ such as about 3V is used, and a base voltage $V_B$ such as about 1.5V is used. In the $2^{nd}$ cycling, a negative bias operation is performed, for example, a read or write voltage $V_{P/E}$ such as about −3V is used, and a base voltage $V_B$ such as about −1.5V is used. As discussed previously with regard to FIG. 5A, the second plurality of switching cycles $2^{nd}$ cycling is referred to as a recovery or an opposite polarity cycling recovery (OPCR).

Figure 7B:
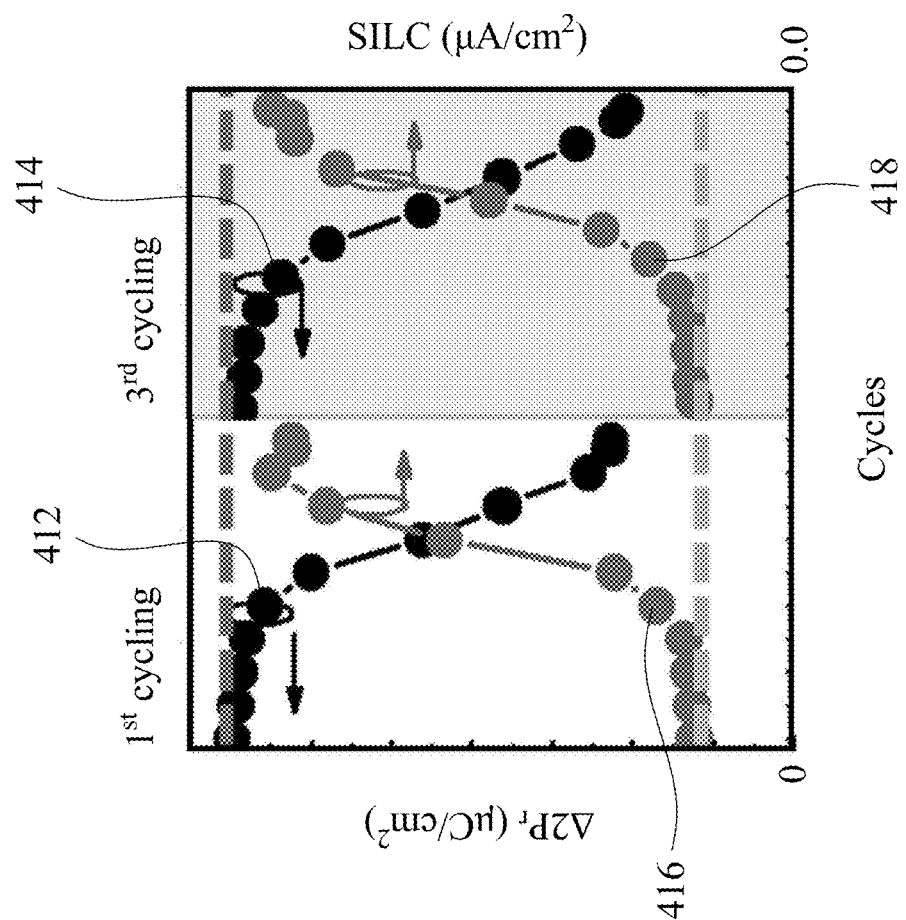
FIG. 7B is a chart of normalized polarization ($\Delta 2Pr$) overlying stress-induced leakage current (SILC) using the first plurality of switching cycles and the third plurality of switching cycles with respect to the memory cell in FIGS. 3A-3C in accordance with some embodiments.

FIG. 7B is a chart of normalized polarization (Δ2Pr) overlying stress-induced leakage current (SILC) using the first plurality of switching cycles $1^{st}$ cycling and the third plurality of switching cycles $3^{rd}$ cycling with respect to the memory cell 10 in FIG. 1 in accordance with some embodiments. Reference is made to FIGS. 1 and 7B. The SILC is measured in a range from 0.5V to 1.5V, such as at about 1V in some embodiments. A curve 412 and a curve 414 show the normalized polarizations (Δ2Pr) with time, and a curve 416 and a curve 418 show the SILC with time. The curve 412 in the first plurality of switching cycles $1^{st}$ cycling and the curve 414 in the third plurality of switching cycles $3^{rd}$ cycling with in a range from $0.5 \times 10^{10}$ to $1 \times 10^{10}$ cycles, such as about $1 \times 10^{10}$ cycles have substantially the same magnitude. The curve 416 in the first plurality of switching cycles $1^{st}$ cycling and the curve 418 with in a range from $0.5 \times 10^{10}$ to $1 \times 10^{10}$ cycles, such as about $1 \times 10^{10}$ cycles in the third plurality of switching cycles $3^{rd}$ cycling have substantially the same magnitude. Such same magnitudes of the normalized polarizations (Δ2Pr) with time and the SILC with time validate a sufficient recovery by the OPCR operation. That is, by using unipolar bias operation and opposite polarity cycling recovery (OPCR) operation, the fatigued variable resistance pattern 106 can be restored back to its initial state, thereby extending the endurance amount of switching cycles for the memory cell. Non-degradation switching polarization ($P_r$) can be achieved.

Figure 7C:
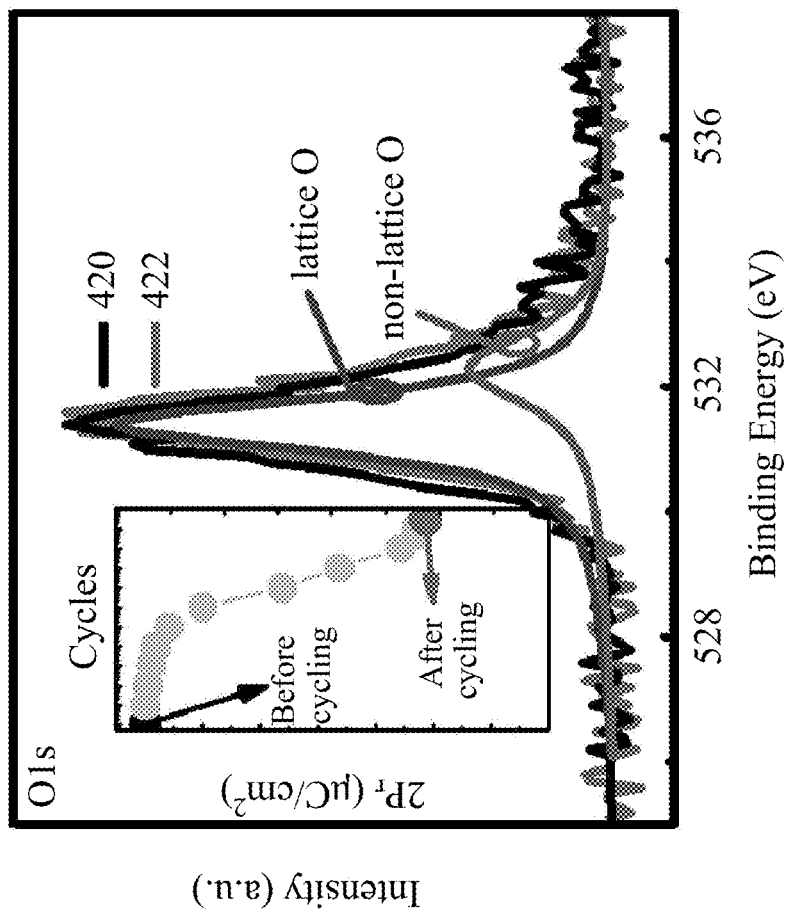
FIG. 7C is an x-ray photoelectron spectroscopy (XPS) experimental data of O 1s from the variable resistance pattern of the memory cell in FIGS. 3A-3C in accordance with some embodiments.

FIG. 7C is an x-ray photoelectron spectroscopy (XPS) experimental data of O 1s from the variable resistance pattern of the memory cell 10 in FIG. 1 in accordance with some embodiments. Reference is made to FIGS. 1 and 7C. A curve 420 indicates XPS spectra of O 1s before cycling, and a curve 422 indicates XPS spectra of O 1s after cycling. The oxygen vacancy is confirmed to be unchanged before and after cycling because the peak positions of lattice oxygen (lattice O) and non-lattice oxygen (non-lattice O) of the curves 420 and 422 have substantially the same magnitude. That is, no additional oxygen vacancy generates during the cycling. In some embodiments, an atomic ratio of the non-lattice O of the variable resistance pattern to a sum of the non-lattice O and the lattice O of the variable resistance pattern is in a range from 20% to 30%, such as 28%. An inset figure shown in FIG. 7C shows a normalized polarization (Δ2$P_r$) of the memory cell 10 with time, indicating that the normalized polarization (Δ2$P_r$) of the memory cell 10 decreases after cycling.

FIG. 8 is an exemplary table indicating data of memory cell 10 in FIG. 1 in accordance with some embodiments. Reference is made to FIGS. 1 and 8. By using unipolar bias operation until the memory cell 10 is fatigued followed by opposite polarity cycling recovery (OPCR), the memory cell 10 can undergo a large amount of cycles in each of the unipolar bias operations and each of the OPCRs. In some embodiments, the variable resistance pattern 106 of the memory cell 10 includes an antiferroelectric material having a thickness of about 8 nm to 12 nm, such as 10 nm and has an amount of cycles per unipolar bias operation being about $1.5 \times 10^{10}$ to about $2.5 \times 10^{10}$ such as about $2 \times 10^{10}$ and an amount of cycles per OPCR is about $1.5 \times 10^{10}$ to about $2.5 \times 10^{10}$ such as about $2 \times 10^{10}$. An amount of cumulative cycles is about is in a range from $5 \times 10^{11}$ to $6 \times 10^{11}$ such as about $5.6 \times 10^{11}$. The unipolar bias operation and the OPCR can be performed at a low programming or erase voltage. For example, the programming or erase voltage can be referred to as cycling ΔV which is about 3±1 V with a frequency of 0.25±0.01 MHz. In other words, in the recovery method (i.e., the OPCR), the recovery ΔV is about 3±1

V with a frequency of 0.25±0.01 MHz. Because the operations using the opposite polarity can be referred to as recovery. The recovery time or period is referred to as about 0%. That is, additional recovery time or period can be omitted. An endurance amount of switching cycles for the memory cell 10 is extended. Non-degradation switching polarization is achieved by using OPCR. In some other embodiments, the cycling voltage is from −20V to 20V. In some embodiments, the recovery has a pulse width in a range from 1 fs to 100 ms. In some embodiments, the recovery has a pulse repetition interval in a range from 1 fs to 100 ms. In some embodiments, a sum of the cycling of unipolar bias operation and the cycling of OPCR is in a range from 1 cycle to $10^{20}$ cycles.

In some other embodiments, an annealing process may further be applied to recovery the memory cell 10. The annealing process may include rapid thermal annealing (RTA) process, laser-spike annealing (LSA), furnace annealing, microwave annealing, flash annealing, the like, or the combination thereof.

In some embodiments, the OPCR operation can be applied to the memory cell 10 of various types, such as ferroelectric random access memory (FeRAM), phase change random access memory (PCRAM), resistive random access memory (ReRAM), dynamic random access memory (DRAM), static random access memory (SRAM), NAND flash memory or the like.

FIGS. 9-17 illustrate schematic cross-sectional views of a memory cell 50 at various stages of fabrication in accordance with some embodiments of the present disclosure. It is understood that additional operations may be provided before, during, and after the operations shown by FIGS. 9-17, and some of the operations described below can be replaced or eliminated for additional embodiments of the method. The order of the operations/processes may be interchangeable.

Figure 9:
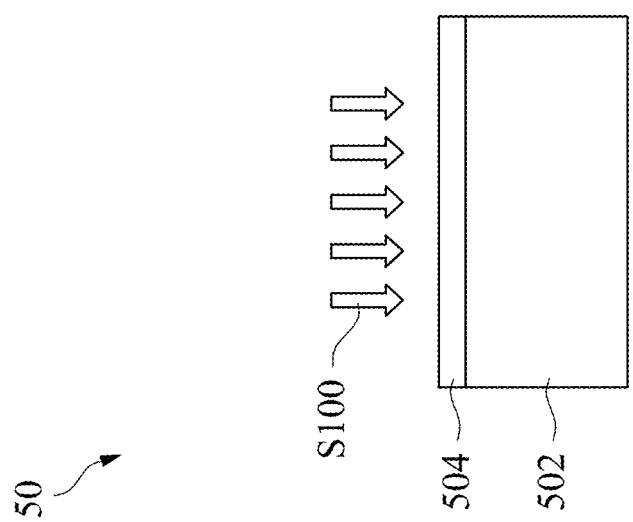
FIGS. 9-16 illustrate schematic cross-sectional views of a memory cell at various stages of fabrication in accordance with some embodiments of the present disclosure.

Reference is made to FIG. 9. A substrate 502 is provided. The substrate 502 may include transistors and one or more interconnect layers formed thereon. The substrate 502 may be a semiconductor substrate, such as silicon substrate. Alternatively, the substrate 502 may include another elementary semiconductor, such as germanium; a compound semiconductor including silicon carbide; an alloy semiconductor including silicon germanium; or combinations thereof. The substrate 502 may include group-IV semiconductor materials, III-V compound semiconductor materials, transition-metal dichalcogenides (TMD). In some embodiments, the substrate 502 is a semiconductor on insulator (SOI) substrate. The substrate 502 may include doped regions, such as p-wells and n-wells. The transistors are formed by suitable transistor fabrication processes and may be a planar transistor, such as polysilicon gate transistors or high-k metal gate transistors, or a multi-gate transistor, such as fin field effect transistors. After the transistors are formed, one or more interconnect layers of a multi-level interconnect (MLI) is formed over the transistors.

As the substrate 502 is exposed to air under ambient conditions, a native oxide layer 504 is formed on the substrate 502. In some embodiments, when the substrate 502 comprises silicon, the native oxide layer 504 may be a thin layer of $SiO_2$. The substrate 502 is subjected to a cleaning process S100 for removing the native oxide layer 504 from the top surface of the substrate 502. The cleaning process may include using suitable cleaning agent, such as diluted water, HF, the like. In some embodiments, the cleaning process S100 is performed in a duration from 50 s to 70 s, such as 60 s.

Figure 10:
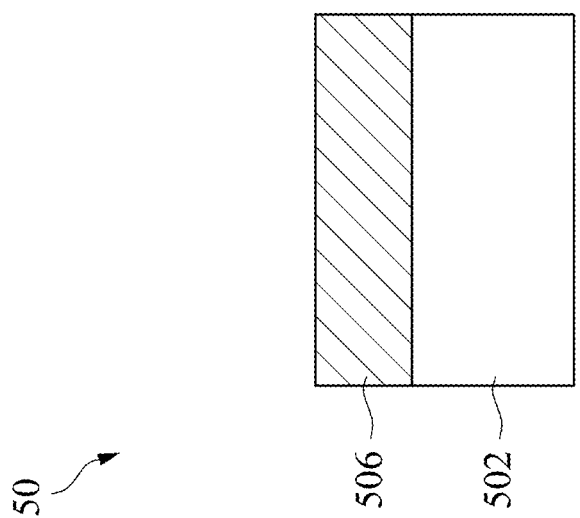

Reference is made to FIG. 10. A bottom electrode layer 506 is deposited over the substrate 502. In some embodiments, the bottom electrode layer 506 may include suitable conductive materials, such as TaN, TiN, W, Pt, Mo, Ta, Ti, metal silicide, the like, and/or the combination thereof. The bottom electrode layer 506 can be a single-layered structure or a multi-layered structure including plural stacked layers of metals and/or metal-containing compounds. The bottom electrode layer 506 may be exemplarily formed by CVD, PVD (e.g., sputtering deposition), ALD, the like, and/or the combination thereof. In some embodiments, a thickness of the bottom electrode layer 506 may be in a range from about 1 nanometer to about 1000 nanometers. In some other embodiments, the bottom electrode layer 506 may have other suitable thickness. In some embodiments, the bottom electrode layer 506 includes a thickness in a range from 1 nm to 10 nm, such as 2 nm.

Figure 11:
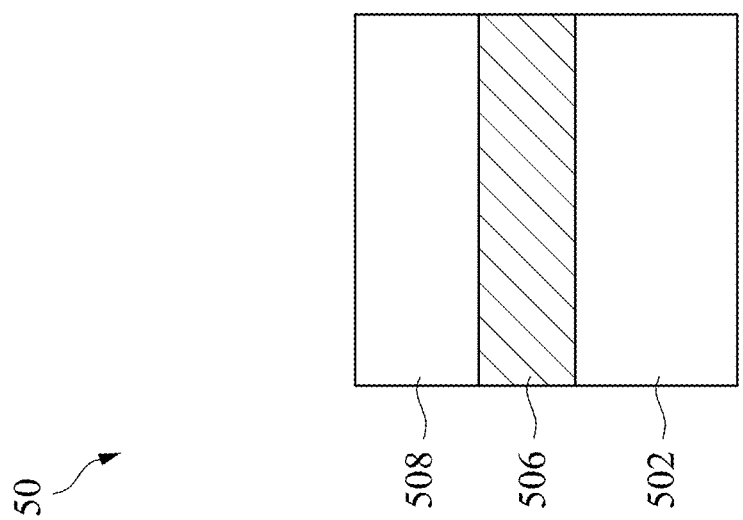

Reference is made to FIG. 11. A variable resistance film 508 is deposited over the bottom electrode layer 506. In some embodiments, the variable resistance film 508 may include hafnium zirconium oxide (HZO), aluminum-doped hafnium oxide (HAO), silicon-doped hafnium oxide (HSO), lead zirconate titanate (PZT), strontium bismuth tantalite (SBT), the like, or a combination thereof. In the embodiments where the variable resistance film 508 is an antiferroelectric film including HZO, the variable resistance film 508 may include $Hf_{1-x}Zr_xO_2$, in which x may be in a range from greater than 50% and less than 100% for antiferroelectric characteristics. Stated differently, a ratio of a Zr content to a sum of Zr content and Hf content in HZO is greater than 50% and less than 100%. For example, the variable resistance film 508 may include $Hf_{0.1}Zr_{0.9}O_2$ or $Hf_{0.25}Zr_{0.75}O_2$. Unlike the antiferroelectric film, a ferroelectric film may include $Hf_{1-x}Zr_xO_2$, in which x may be in a range from greater than 0% and less than 50% for ferroelectric characteristics. The variable resistance film 508 may be formed by an ALD process or a PVD process. For example, the variable resistance film 508 is deposited with a thickness in a range from about 0.1 nanometer to about 50 nanometers in some embodiments. In some further embodiments, the thickness of the variable resistance film 508 may be in a range from about 20 nanometers to about 50 nanometers in some embodiments. In some embodiments, the variable resistance film 508 includes a thickness in a range from 5 nm to 15 nm, such as 10 nm. In some embodiments, the variable resistance film 508 has a tetragonal structure, an orthorhombic structure or a combination thereof.

Figure 12:
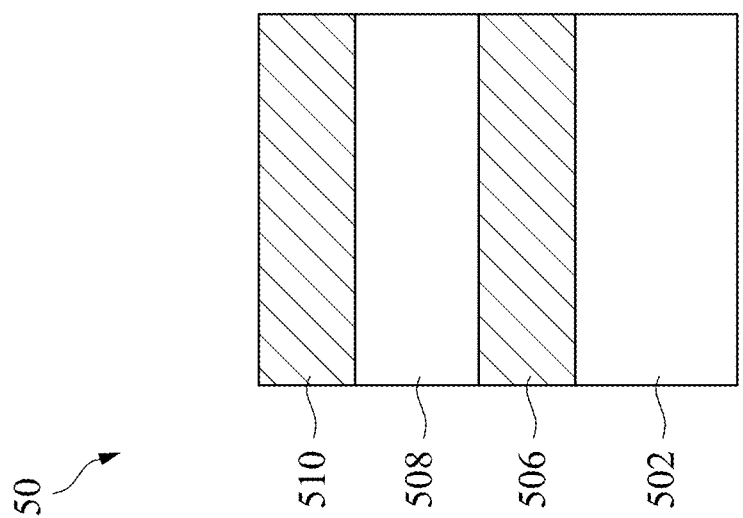

Reference is made to FIG. 12. A top electrode layer 510 is deposited over the variable resistance film 508. In some embodiments, the top electrode layer 510 may include suitable conductive materials, such as TaN, TiN, W, Pt, Mo, Ta, Ti, metal silicide, the like, and/or the combination thereof. The top electrode layer 510 can be a single-layered structure or a multi-layered structure including plural stacked layers of metals and/or metal-containing compounds. The top electrode layer 510 may be exemplarily formed by CVD, PVD (e.g., sputtering deposition), ALD, the like, and/or the combination thereof. In some embodiments, a thickness of the top electrode layer 510 may be in a range from about 1 nanometer to about 1000 nanometers. In some other embodiments, the top electrode layer 510 may have other suitable thickness. The top electrode layer 510 may include a conductive material the same as or different from that of the bottom electrode layer 506. In some embodiments, the top electrode layer 120 includes a thickness in a range from 70 nm to 90 nm, such as 80 nm.

Figure 13:
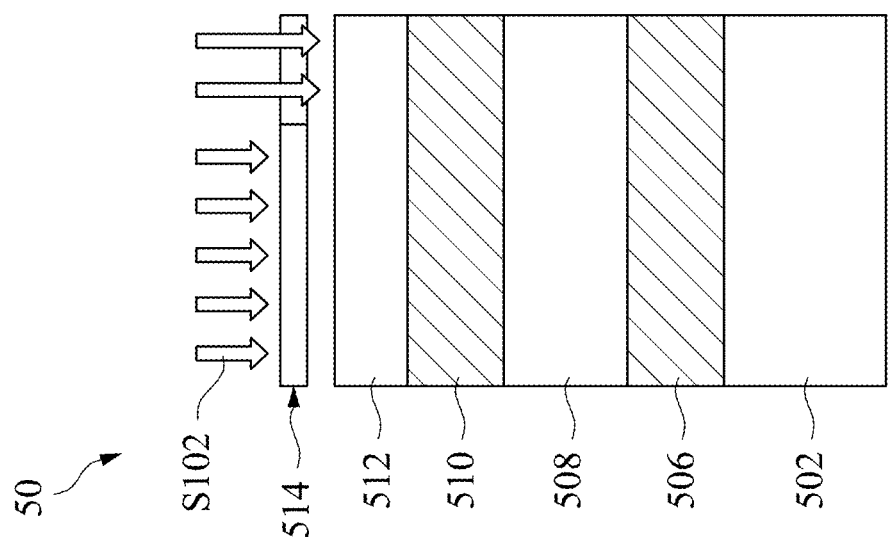

Reference is made to FIG. 13. A resist layer 512 is formed over the top electrode layer 510. In some embodiments, the resist layer 512 is an ashing removable dielectric (ARD), which is a photoresist-like material generally having generally the properties of a photoresist and amendable to etching and patterning like a photoresist. The resist layer 512 may also acts as a mask layer for patterning underlying layers in some embodiments. The resist layer 512 may be formed by spin-on coating. In some embodiments, an exposure apparatus including a light source and a mask 514 is used for providing light S102 for the exposing the resist layer 512. The resist layer 512 may be patterned using suitable photolithography process, thereby forming the variable resistance pattern 508' (referring to FIG. 14). For example, the process may include photoresist coating (e.g., spin-on coating), soft baking, mask aligning, exposure, post-exposure baking, developing the photoresist, rinsing, drying (e.g., hard baking), other suitable processes, or combinations thereof.

Figure 14:
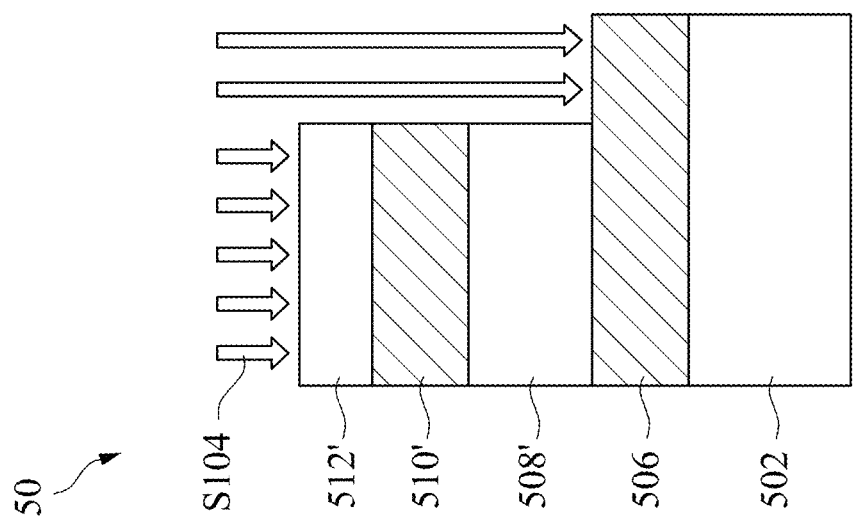

Reference is made to FIG. 14. One or more etching processes S104 are performed to etch portions of the films/layers 508, 510 (referring to FIG. 13) through the patterned resist layer 512', such that portions of the films/layers 508, 510 (referring to FIG. 13) uncovered by the patterned resist layer 512' are removed. The remaining portions of the films/layers 508, 510 (referring to FIG. 13) form a variable resistance pattern 508' and a top electrode 510', respectively. Stated differently, through the photolithography process and the etching process, the films/layers 508, 510 (referring to FIG. 13) are patterned into the variable resistance patterns 508' and the top electrode 510', respectively. The one or more etching processes may include a dry etch using fluoride-based etchants, such as $CF_4$. In some other embodiments, the bottom electrode layer 506 may also be patterned through the etching process.

Figure 15A:
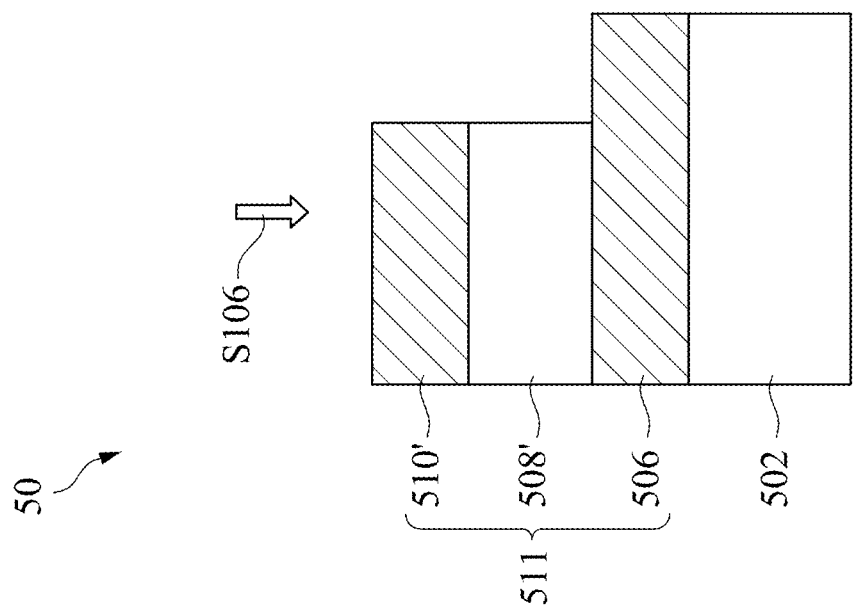

After the patterning process, an annealing process S106 may be performed to the resulting structure, as shown in FIG. 15A. The bottom electrode layer 506, the variable resistance pattern 508' and the top electrode 510' constitute a capacitor 511 for storing memory data. The annealing process S106 can convert the variable resistance pattern 508' from an amorphous structure to a crystal structure, such as a tetragonal phase. The annealing process S106 may include rapid thermal annealing (RTA) process, laser-spike annealing (LSA), furnace annealing, microwave annealing, flash annealing, the like, or the combination thereof. The memory cell 50 includes the bottom electrode layer 506, the variable resistance pattern 508', and the top electrode 510', respectively corresponding to the bottom electrode 104, the variable resistance pattern 106, and the top electrode 108 in FIG. 1.

Figure 15D:
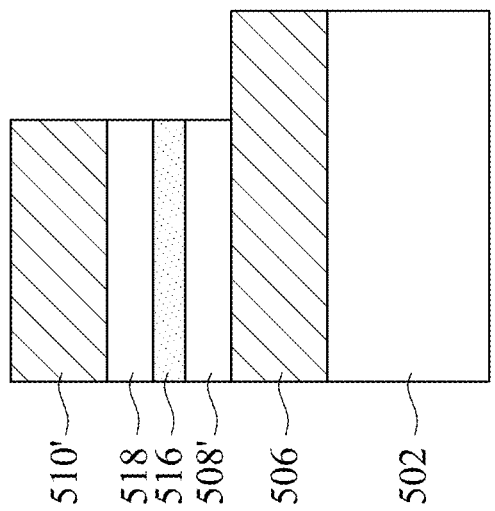
Figure 15C:
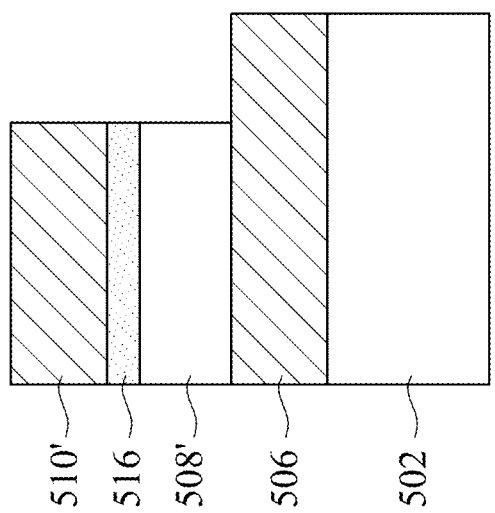
Figure 15B:
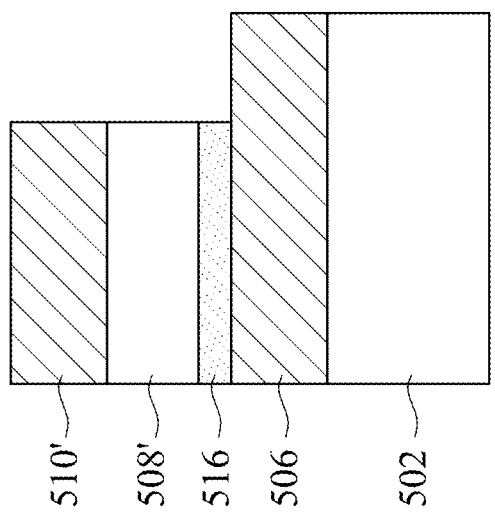

FIGS. 15B, 15C and 15D are schematic cross-sectional views of memory cells in accordance with some embodiments of the present disclosure. Reference is made to FIG. 15B. A dielectric layer 516 is deposited over the bottom electrode layer 506. For example, the dielectric layer 516 is between the bottom electrode layer 506 and the variable resistance pattern 508'. The dielectric layer 516 may include suitable dielectric materials, such as $SiO_2$, $Al_2O_3$, $HfO_2$, $ZrO_2$, the like, or the combination thereof. In some embodiments, the dielectric layer 516 may be a high-k dielectric layer made of suitable high-k dielectric materials that have a dielectric constant greater than 3.9. In some embodiments, the dielectric layer 516 has an electrical resistivity much greater than that of the bottom electrode layer 506. In the present embodiments, the dielectric layer 516 may be formed by ALD. In some other embodiments, the dielectric layer 516 may be formed by ALD, CVD, the like, and/or the combination thereof. In some embodiments, a thickness of the dielectric layer 516 may be in a range from about 0.1 nanometer to about 10 nanometers. In some other embodiments, the dielectric layer 516 may have other suitable thickness.

The dielectric layer 516 may be $SiO_2$, $Al_2O_3$, $HfO_2$, $ZrO_2$ or the like and has a thickness in a range from 0.1 nm to 10 nm. The memory cell in FIG. 15C is similar to the memory cell in FIG. 15B, except for the dielectric layer 516 being over the variable resistance pattern 508'. In other words, the dielectric layer 516 is between the top electrode 510' and the variable resistance pattern 508'. The memory cell in FIG. 15D is similar to the memory cell in FIG. 15B, except for the dielectric layer 516 being between the variable resistance pattern 508' and an additional variable resistance pattern 518. That is, the dielectric layer 516 is sandwiched between the variable resistance patterns 508', 518. The variable resistance pattern 518 is similar to the variable resistance pattern 508' in terms of composition and formation method, and thus the description thereof is omitted herein.

Figure 16:
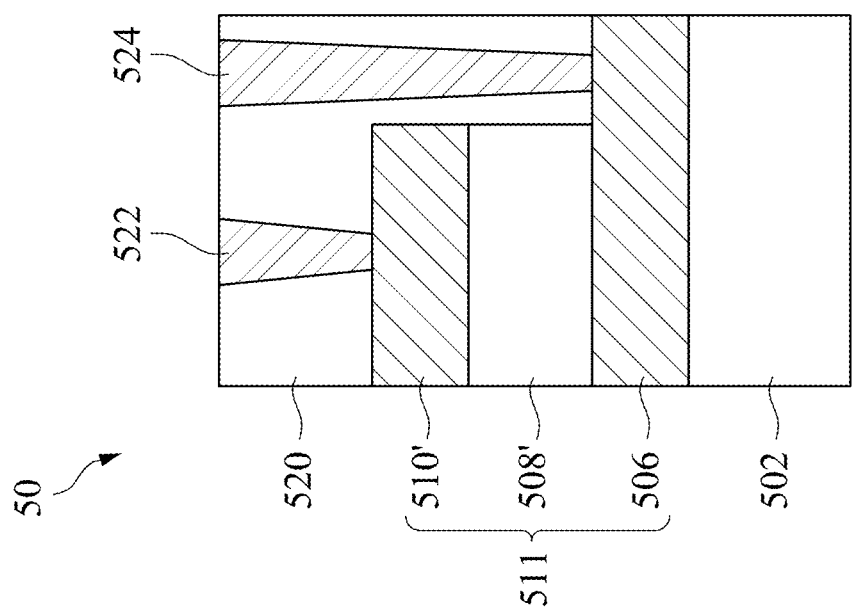

Reference is made to FIG. 16. In some embodiments, an inter-layer dielectric (ILD) layer 520 may be formed around the capacitor 511. The ILD layer 520 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. In some embodiments, a top electrode via 522 and a bottom electrode via 524 may be formed in the ILD layer 520, and landing on a top surface of the top electrode 510' and a top surface of the bottom electrode layer 506, respectively. Formation of the top electrode via 522 and the bottom electrode via 524 may include etching openings in the ILD layer 520, and filling the openings with suitable conductive materials, followed by a planarization process (e.g., chemical mechanical polish (CMP) process). The top electrode via 522 and the bottom electrode via 524 may include suitable conductive materials, such as aluminum, aluminum alloy, copper, copper alloy, titanium, titanium nitride, tantalum, tantalum nitride, tungsten, cobalt, the like, and/or combinations thereof. In some other embodiments, the bottom electrode layer 506 may be electrically connected with underlying interconnect layers, and the bottom electrode via 524 may be omitted.

Figure 17:
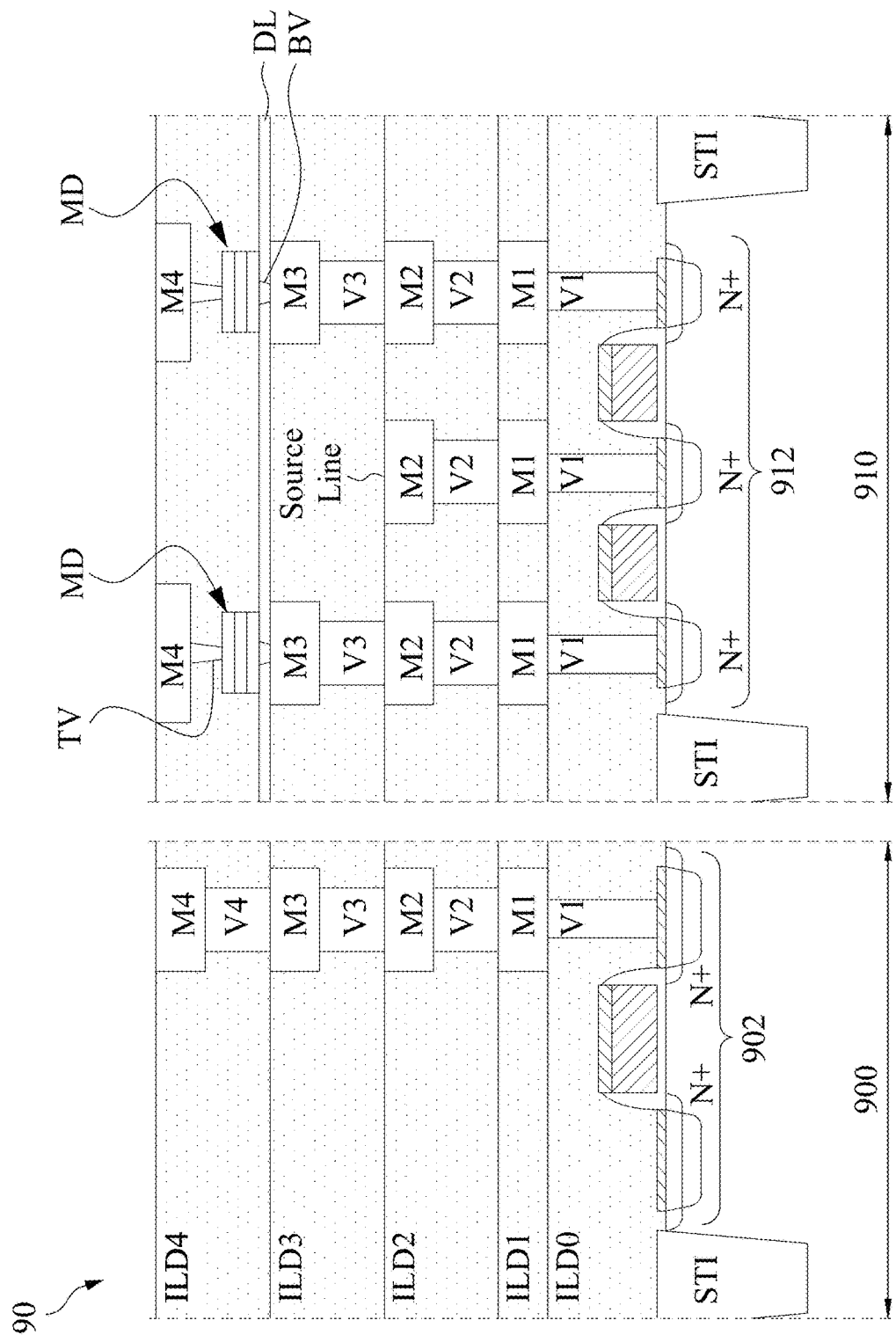
FIG. 17 is a schematic cross-sectional view of an integrated circuit device having memory cells in accordance with some embodiments of the present disclosure.

FIG. 17 is a schematic cross-sectional view of an integrated circuit device 90 having memory cells MD in accordance with some embodiments of the present disclosure. The integrated circuit device 90 includes a logic region 900 and a memory region 910. The logic region 900 may include circuitry, such as an exemplary logic transistor 902, for processing information received from the memory cell MD in the memory region 910 and for controlling reading and writing functions of the memory cell MD. In some embodiments, the memory cell MD may be similar to those shown above. In some embodiments, the memory cell MD is located on a bottom electrode via BV connected to underlying metallization layer. The formation of the bottom electrode via BV may include depositing a dielectric layer DL, etching an opening in the dielectric layer DL, and filling the opening with suitable conductive material, followed by a CMP process.

As depicted, the integrated circuit device 90 is fabricated using four metallization layers, labeled as M1 through M4, with four layers of metallization vias or interconnects, labeled as V1 through V4. Other embodiments may contain more or fewer metallization layers and a corresponding more or fewer number of vias. The logic region 900 includes a full metallization stack, including a portion of each of metallization layers M1-M4 connected by interconnects V2-V4, with V1 connecting the stack to a source/drain contact of the logic transistor 902. The memory region 910 includes a full metallization stack connecting the memory cell MD to transistors 912 in the memory region 910, and a partial metallization stack connecting a source line to the transistors 912 in the memory region 910. The memory cells MD are depicted as being fabricated in between the top of the M3 layer and the bottom of the M4 layer. In the illustrated embodiments, a top electrode via TV connects the top electrode TE to the M4 layer, and a bottom electrode via BV connects the bottom electrode BE to the M3 layer. Also included in semiconductor device is a plurality of ILD layers. Five ILD layers, identified as ILD0 through ILD4 are depicted as spanning the logic region 900 and the memory region 910. The ILD layers may provide electrical insulation as well as structural support for the various features of the semiconductor device during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by using unipolar bias operation and opposite polarity cycling recovery (OPCR) operation, a fatigued antiferroelectric capacitor can be restored back to its initial state, thereby extending the endurance amount of switching cycles for the memory cell. Another advantage is that the memory cell can have sufficient memory states such as four memory states for the unipolar operation. Another advantage is that non-degradation switching polarization ($P_r$) can be achieved. Also, another advantage is that the programming or erase voltage can be low. Moreover, another advantage is that additional recovery time or period can be omitted.

In some embodiments, a method of operating a memory cell includes the following steps. A first plurality of bias operations is performed to the memory cell using a first voltage, wherein the memory cell comprises a variable resistance pattern, and the first voltage of each cycle of the first plurality of bias operations has a same first polarity. The memory cell is determined whether reaches a fatigue threshold. After the determination determines that the memory cell reaches the fatigue threshold, a second plurality of bias operations is performed to the memory cell using a second voltage, wherein the second voltage of each cycle of the second plurality of bias operations has a same second polarity, and the second polarity is opposite to the first polarity. In some embodiments, the first polarity is positive, and the second polarity is negative. In some embodiments, the first polarity is negative, and the second polarity is positive. In some embodiments, the second voltage has an amplitude not greater than an amplitude of the first voltage. In some embodiments, the second voltage has an amplitude substantially the same as an amplitude of the first voltage. In some embodiments, the second voltage has an absolute value being less than bout 8 volts. In some embodiments, the first voltage has an absolute value being less than about 8 volts.

In some embodiments, a method of operating a memory cell includes the following steps. The memory cell is cycled until the memory cell is fatigued using a first positive bias operation. The memory cell comprises a bottom electrode, a variable resistance pattern over the bottom electrode and a top electrode over the variable resistance pattern. The memory cell is recovered using a first negative bias operation. In some embodiments, the variable resistance pattern of the memory cell comprises an antiferroelectric material. In some embodiments, the antiferroelectric material of the memory cell comprises $Hf_{1-x}Zr_xO_2$, and x is in a range from greater than 0.5 and less than 1. In some embodiments, recovering the memory cell using the first negative bias operation is performed until the memory cell is fatigued again. In some embodiments, the method further includes after recovering the memory cell using the first negative bias operation, cycling the memory cell until the memory cell is fatigued again using a second positive bias operation and recovering the memory cell using a second negative bias operation. In some embodiments, recovering the memory cell using the second negative bias operation is performed until the memory cell is fatigued again. In some embodiments, cycling the memory cell using the first positive bias operation is performed using a voltage having an amplitude substantially the same as an amplitude of a voltage used of recovering the memory cell using the first negative bias operation.

In some embodiments, a method includes the following steps. A memory cell is operated using a first unipolar bias operation, wherein the memory cell comprises an antiferroelectric material having a plurality of antiferroelectric positive unipolar domains and a plurality of antiferroelectric negative unipolar domains, and wherein oxygen vacancies are accumulated in the plurality of antiferroelectric negative unipolar domains after performing the first unipolar bias operation. The oxygen vacancies are redistributed in the plurality of antiferroelectric negative unipolar domains to the plurality of antiferroelectric positive unipolar domains. In some embodiments, operating the memory cell and redistributing the oxygen vacancies are performed using opposite voltages. In some embodiments, redistributing the oxygen vacancies is performed using a positive voltage. In some embodiments, operating the memory cell is performed until the memory cell is fatigued. In some embodiments, redistributing the oxygen vacancies is performed until the memory cell is fatigued. In some embodiments, redistributing the oxygen vacancies is performed using a second unipolar bias operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory cell, comprising:
   performing a first plurality of bias operations to the memory cell using a first voltage, wherein the memory cell comprises a variable resistance pattern, and the first voltage of each cycle of the first plurality of bias operations has a same first polarity;
   determining whether the memory cell reaches a fatigue threshold; and after the determination determines that the memory cell reaches the fatigue threshold, performing a second plurality of bias operations to the memory cell using a second voltage, wherein the second voltage of each cycle of the second plurality of bias operations has a same second polarity, and the second polarity is opposite to the first polarity, the first voltage and the second voltage have a same amplitude variation.

2. The method of claim 1, wherein the first polarity is positive, and the second polarity is negative.

3. The method of claim 1, wherein the first polarity is negative, and the second polarity is positive.

4. The method of claim 1, wherein the second voltage has an amplitude not greater than an amplitude of the first voltage.

5. The method of claim 1, wherein the second voltage has an amplitude substantially the same as an amplitude of the first voltage.

6. The method of claim 1, wherein the second voltage has an absolute value being less than bout 8 volts.

7. The method of claim 1, wherein the first voltage has an absolute value being less than about 8 volts.

8. The method of claim 1, wherein the first voltage has a first constant amplitude, and the second voltage has a second constant amplitude.

9. A method of operating a memory cell, comprising:
cycling the memory cell until the memory cell is fatigued using a first positive bias operation, wherein the memory cell comprises:
a bottom electrode;
a variable resistance pattern over the bottom electrode, wherein the variable resistance pattern of the memory cell comprises an antiferroelectric material; and
a top electrode over the variable resistance pattern; and
recovering the memory cell using a first negative bias operation.

10. The method of claim 9, wherein the antiferroelectric material of the memory cell comprises $Hf_{1-x}Zr_xO_2$, and x is in a range from greater than 0.5 and less than 1.

11. The method of claim 9, wherein recovering the memory cell using the first negative bias operation is performed until the memory cell is fatigued again.

12. The method of claim 9, further comprising:
after recovering the memory cell using the first negative bias operation, cycling the memory cell until the memory cell is fatigued again using a second positive bias operation; and
recovering the memory cell using a second negative bias operation.

13. The method of claim 12, wherein recovering the memory cell using the second negative bias operation is performed until the memory cell is fatigued again.

14. The method of claim 9, wherein cycling the memory cell using the first positive bias operation is performed using a voltage having an amplitude substantially the same as an amplitude of a voltage used of recovering the memory cell using the first negative bias operation.

15. A method, comprising:
operating a memory cell using a first unipolar bias operation, wherein the memory cell comprises an antiferroelectric material having a plurality of antiferroelectric positive unipolar domains and a plurality of antiferroelectric negative unipolar domains, and wherein oxygen vacancies are accumulated in the plurality of antiferroelectric negative unipolar domains after performing the first unipolar bias operation; and
redistributing the oxygen vacancies in the plurality of antiferroelectric negative unipolar domains to the plurality of antiferroelectric positive unipolar domains.

16. The method of claim 15, wherein operating the memory cell and redistributing the oxygen vacancies are performed using opposite voltages.

17. The method of claim 15, wherein redistributing the oxygen vacancies is performed using a positive voltage.

18. The method of claim 15, wherein operating the memory cell is performed until the memory cell is fatigued.

19. The method of claim 15, wherein redistributing the oxygen vacancies is performed until the memory cell is fatigued.

20. The method of claim 15, wherein redistributing the oxygen vacancies is performed using a second unipolar bias operation.

* * * * *